(12) United States Patent
Hemink et al.

(10) Patent No.: US 7,457,166 B2
(45) Date of Patent: Nov. 25, 2008

(54) ERASE VOLTAGE MANIPULATION IN NON-VOLATILE MEMORY FOR CONTROLLED SHIFTS IN THRESHOLD VOLTAGE

(75) Inventors: Gerrit Jan Hemink, Yokohama (JP); Teruhiko Kamei, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/773,921

(22) Filed: Jul. 5, 2007

(65) Prior Publication Data

US 2008/0013360 A1 Jan. 17, 2008

Related U.S. Application Data

(63) Continuation-in-part of application No. 11/296,055, filed on Dec. 6, 2005, now Pat. No. 7,403,424, and a continuation-in-part of application No. 11/296,028, filed on Dec. 6, 2005, now Pat. No. 7,400,537.

(60) Provisional application No. 60/667,043, filed on Mar. 31, 2005.

(51) Int. Cl.
*G11C 11/34* (2006.01)
(52) U.S. Cl. .............. 365/185.29; 365/185.22; 365/218; 365/185.18
(58) Field of Classification Search ............ 365/185.29, 365/185.22, 185.18
See application file for complete search history.

(56) References Cited

U.S. PATENT DOCUMENTS 4,489,400 A 12/1984 Southerland, Jr.
4,580,247 A 4/1986 Adam (Continued)

FOREIGN PATENT DOCUMENTS

WO WO0024002 4/2000

(Continued)

OTHER PUBLICATIONS

Tetsuo Endoh, et al., "A Study of High-Performance NAND Structured EEPROMS," IEICE Transactions on Electronics, Electronics Society, Tokyo, Japan, vol. E75-C, No. 11, Nov. 1, 1992, pp. 1351-1356.

(Continued)

*Primary Examiner*—Anh Phung
*Assistant Examiner*—Nam Nguyen
(74) *Attorney, Agent, or Firm*—Vierra Magen Marcus & DeNiro LLP

(57) ABSTRACT

The erase voltage applied to a set of non-volatile storage elements being erased is structured to provide controlled shifts in the threshold voltage of the storage elements. The erase voltage is applied as a series of voltage pulses, when necessary, to shift the threshold voltage of to-be-erased memory cells below a verify level indicative of an erased condition. To avoid over-erasing the memory cells, the second erase voltage pulse is decreased, or not increased, in magnitude when compared to the previously applied voltage pulse. By decreasing or not increasing the size of the erase voltage, the amount of charge transferred from the cells by the second pulse is controlled to more accurately position an erased threshold voltage distribution for the cells near the verify level. Subsequent erase voltage pulses are increased in magnitude to provide further erasing when needed.

25 Claims, 21 Drawing Sheets

U.S. PATENT DOCUMENTS

| | | | |
|---|---|---|---|
| 5,293,337 | A | 3/1994 | Aritome et al. |
| 5,428,568 | A | 6/1995 | Kobayashi et al. |
| 5,491,809 | A | 2/1996 | Coffman et al. |
| 5,555,204 | A | 9/1996 | Endoh et al. |
| 5,570,315 | A | 10/1996 | Tanaka et al. |
| 5,576,993 | A | 11/1996 | Hong |
| 5,652,719 | A | 7/1997 | Tanaka et al. |
| 5,768,188 | A | 6/1998 | Park et al. |
| 5,774,397 | A | 6/1998 | Endoh et al. |
| 5,808,338 | A | 9/1998 | Gotou |
| 5,841,721 | A | 11/1998 | Kwon et al. |
| 5,946,231 | A | 8/1999 | Endoh et al. |
| 5,963,477 | A | 10/1999 | Hung |
| 5,978,270 | A | 11/1999 | Tanaka et al. |
| 5,995,417 | A | 11/1999 | Chen et al. |
| 6,031,760 | A | 2/2000 | Sakui et al. |
| 6,041,001 | A | 3/2000 | Estakhri |
| 6,046,935 | A | 4/2000 | Takeuchi et al. |
| 6,046,940 | A | 4/2000 | Takeuchi et al. |
| 6,108,238 | A | 8/2000 | Nakamura et al. |
| 6,130,841 | A | 10/2000 | Tanaka et al. |
| 6,134,140 | A | 10/2000 | Tanaka et al. |
| 6,166,962 | A | 12/2000 | Chen et al. |
| 6,185,134 | B1 | 2/2001 | Tanaka |
| 6,198,662 | B1 | 3/2001 | Chen et al. |
| 6,222,773 | B1 | 4/2001 | Tanzawa et al. |
| 6,249,459 | B1 | 6/2001 | Chen et al. |
| 6,353,556 | B2 | 3/2002 | Chen et al. |
| 6,381,174 | B1 | 4/2002 | Roohparvar et al. |
| 6,421,276 | B1 | 7/2002 | Goltman |
| 6,452,840 | B1 | 9/2002 | Sunkavalli et al. |
| 6,483,751 | B2 | 11/2002 | Chen et al. |
| 6,519,184 | B2 | 2/2003 | Tanaka et al. |
| 6,525,964 | B2 | 2/2003 | Tanaka et al. |
| 6,529,413 | B2 | 3/2003 | Lee et al. |
| 6,594,178 | B2 | 7/2003 | Choi et al. |
| 6,618,288 | B2 | 9/2003 | Akaogi et al. |
| 6,620,682 | B1 | 9/2003 | Lee et al. |
| 6,643,181 | B2 * | 11/2003 | Sofer et al. ............ 365/185.22 |
| 6,643,183 | B2 | 11/2003 | Atsumi et al. |
| 6,643,184 | B2 | 11/2003 | Pio |
| 6,643,188 | B2 | 11/2003 | Tanaka et al. |
| 6,646,920 | B2 | 11/2003 | Takashina et al. |
| 6,664,587 | B2 | 12/2003 | Guterman et al. |
| 6,704,222 | B2 | 3/2004 | Guterman et al. |
| 6,711,066 | B2 | 3/2004 | Tanzawa et al. |
| 6,744,670 | B2 | 6/2004 | Tamada et al. |
| 6,771,541 | B1 | 8/2004 | Park |
| 6,807,100 | B2 | 10/2004 | Tanaka |
| 6,818,491 | B2 | 11/2004 | Lee et al. |
| 6,842,380 | B2 | 1/2005 | Lakhani et al. |
| 6,859,397 | B2 | 2/2005 | Lutze et al. |
| 6,862,223 | B1 | 3/2005 | Lee et al. |
| 6,894,931 | B2 | 5/2005 | Yaegashi et al. |
| 6,954,378 | B2 | 10/2005 | Tanaka |
| 7,009,889 | B2 | 3/2006 | Tran et al. |
| 7,057,936 | B2 | 6/2006 | Yaegashi et al. |
| 7,079,437 | B2 | 7/2006 | Hazama et al. |
| 7,102,929 | B2 | 9/2006 | Lee et al. |
| 2002/0133679 | A1 | 9/2002 | Choi et al. |
| 2003/0123296 | A1 | 7/2003 | Hirano |
| 2003/0147278 | A1 | 8/2003 | Tanaka et al. |
| 2003/0189864 | A1 | 10/2003 | Sim |
| 2004/0141378 | A1 | 7/2004 | Tanzawa |
| 2005/0041515 | A1 | 2/2005 | Futatsuyama et al. |
| 2005/0105373 | A1 | 5/2005 | Takase et al. |
| 2005/0128805 | A1 | 6/2005 | Lee et al. |
| 2005/0265097 | A1 | 12/2005 | Tanaka et al. |
| 2006/0114729 | A1 | 6/2006 | Tanaka et al. |
| 2006/0140012 | A1 | 6/2006 | Wan et al. |
| 2006/0221660 | A1 | 10/2006 | Hemink et al. |
| 2006/0221661 | A1 | 10/2006 | Hemink et al. |
| 2006/0221703 | A1 | 10/2006 | Higashitani |
| 2006/0221705 | A1 | 10/2006 | Hemink et al. |
| 2006/0221708 | A1 | 10/2006 | Higashitani |
| 2006/0221709 | A1 | 10/2006 | Hemink et al. |
| 2006/0279992 | A1 | 12/2006 | Park et al. |
| 2006/0285387 | A1 | 12/2006 | Micheloni et al. |

FOREIGN PATENT DOCUMENTS

WO    WO2004013864    2/2004

OTHER PUBLICATIONS

U.S. Appl. No. 11/549,515, filed Oct. 13, 2006.
U.S. Appl. No. 11/549,533, filed Oct. 13, 2006.
U.S. Appl. No. 11/549,553, filed Oct. 13, 2006.
U.S. Appl. No. 11/549,564, filed Oct. 13, 2006.
U.S. Appl. No. 11/773,927, filed Jul. 5, 2007.
Notice of Allowance and Fee(s) Due, United States & Trademark Office, U.S. Appl. No. 11/773,927 filed on Jul. 5, 2007, Sep. 9, 2008.

* cited by examiner

| | Erase | Erase verify |
|---|---|---|
| Bit Line | Floating | Floating |
| SGD | Floating | $V_{SG}$ |
| WLn | 0V | 0V |
| WLn-1 | 0V | 0V |
| . | 0V | 0V |
| . | 0V | 0V |
| WLi | 0V | 0V |
| . | 0V | 0V |
| . | 0V | 0V |
| WL1 | 0V | 0V |
| WL0 | 0V | 0V |
| SGS | Floating | $V_{SG}$ |
| Source Line | Floating | $V_{DD}$ |
| P-well | $V_{erase}$ | 0V |

Erase Potential = $V_{erase} - V_{FG}$ = 20V − 9V = 11V

Erase Potential = $V_{erase} - V_{FG}$ = 20V − 10V = 10V

|  | All WL erase | Interior WL verify | End WL erase | End WL verify |
|---|---|---|---|---|
| Bit Line | Floating | 0V | Floating | 0V |
| SGD | Floating | $V_{SG}$ | Floating | $V_{SG}$ |
| $WL_n$ | 0V | $V_{use1}$ | 0V | $E_{verify}$ |
| $WL_{n-1}$ | 0V | $E_{verify}$ | Floating | $V_{use1}$ |
| . | 0V | $E_{verify}$ | Floating | $V_{use1}$ |
| . | 0V | $E_{verify}$ | Floating | $V_{use1}$ |
| $WL_i$ | 0V | $E_{verify}$ | Floating | $V_{use1}$ |
| . | 0V | $E_{verify}$ | Floating | $V_{use1}$ |
| . | 0V | $E_{verify}$ | Floating | $V_{use1}$ |
| $WL_1$ | 0V | $E_{verify}$ | Floating | $V_{use1}$ |
| $WL_0$ | 0V | $V_{use1}$ | 0V | $E_{verify}$ |
| SGS | Floating | $V_{SG}$ | Floating | $V_{SG}$ |
| Source Line | Floating | $V_{DD}$ | Floating | $V_{DD}$ |
| P-well | $V_{erase}$ | 0V | $V_{erase}$ | 0V |

Column headers labeled 660, 662, 664, 666.

*FIG. 20*

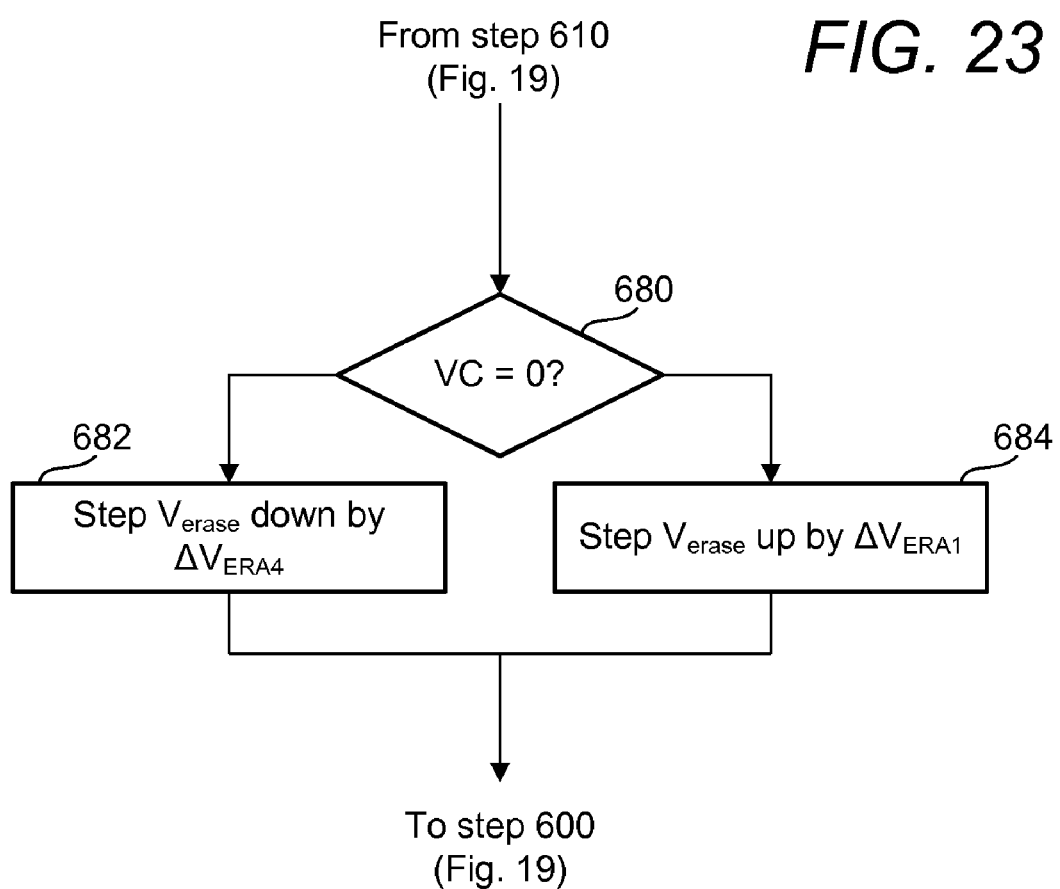

|  | 750 Soft-programming all WLs | 752 Soft-programming verify all WLs | 754 Soft-programming end WLs | 756 Soft-programming verify end WLs |
|---|---|---|---|---|
| Bit Line | 0V ($V_{DD}$) | floating | 0V ($V_{DD}$) | floating |
| SGD | $V_{SG}$ | $V_{SG}$ | $V_{SG}$ | $V_{SG}$ |
| $WL_n$ | $V_{spgm}$ | $E_{verify}$ | $V_{spgm}$ | $E_{verify}$ |
| $WL_{n-1}$ | $V_{spgm}$ | $E_{verify}$ | $V_{use1}$ | $V_{use1}$ |
| . | $V_{spgm}$ | $E_{verify}$ | $V_{use1}$ | $V_{use1}$ |
| . | $V_{spgm}$ | $E_{verify}$ | $V_{use1}$ | $V_{use1}$ |
| $WL_i$ | $V_{spgm}$ | $E_{verify}$ | $V_{use1}$ | $V_{use1}$ |
| . | $V_{spgm}$ | $E_{verify}$ | $V_{use1}$ | $V_{use1}$ |
| . | $V_{spgm}$ | $E_{verify}$ | $V_{use1}$ | $V_{use1}$ |
| $WL_1$ | $V_{spgm}$ | $E_{verify}$ | $V_{use1}$ | $V_{use1}$ |
| $WL_0$ | $V_{spgm}$ | $E_{verify}$ | $V_{spgm}$ | $E_{verify}$ |
| SGS | 0V | $V_{SG}$ | $V_{SG}$ | $V_{SG}$ |
| Source Line | 0V | $V_{DD}$ | 0V | $V_{DD}$ |
| P-well | 0V | 0V | 0V | 0V |

*FIG. 26*

ERASE VOLTAGE MANIPULATION IN NON-VOLATILE MEMORY FOR CONTROLLED SHIFTS IN THRESHOLD VOLTAGE

PRIORITY CLAIM

The present application is a continuation-in-part of U.S. patent application Ser. No. 11/296,055, entitled "ERASING NON-VOLATILE MEMORY USING INDIVIDUAL VERIFICATION AND ADDITIONAL ERASING OF SUBSETS OF MEMORY CELLS," by Hemink et al., filed Dec. 6, 2005 and U.S. patent application Ser. No. 11/296,028, entitled, "SYSTEMS FOR ERASING NON-VOLATILE MEMORY USING INDIVIDUAL VERIFICATION AND ADDITIONAL ERASING OF SUBSETS OF MEMORY CELLS," by Hemink et al., filed Dec. 6, 2005, both of which claim priority from U.S. Provisional Patent Application No. 60/667,043, entitled "NON-VOLATILE MEMORY ERASE OPERATIONS WITH OVER-ERASE PROTECTION," by Hemink et al., filed Mar. 31, 2005. The three above-identified patent applications are incorporated by reference herein in their entirety.

CROSS-REFERENCE TO RELATED APPLICATIONS

The following applications are cross-referenced and incorporated by reference herein in their entirety:

U.S. patent application Ser. No. 11/773,927, entitled, "SYSTEMS FOR ERASE VOLTAGE MANIPULATION IN NON-VOLATILE MEMORY FOR CONTROLLED SHIFTS IN THRESHOLD VOLTAGE," by Hemink et al., filed concurrently;

U.S. patent application Ser. No. 11/295,747, entitled, "SOFT PROGRAMMING NON-VOLATILE MEMORY UTILIZING INDIVIDUAL VERIFICATION AND ADDITIONAL SOFT PROGRAMMING OF SUBSETS OF MEMORY CELLS," by Hemink et al., filed Dec. 6, 2005;

U.S. patent application Ser. No. 11/296,071, entitled, "SYSTEMS FOR SOFT PROGRAMMING NON-VOLATILE MEMORY UTILIZING INDIVIDUAL VERIFICATION AND ADDITIONAL SOFT PROGRAMMING OF SUBSETS OF MEMORY CELLS," by Hemink et al., filed Dec. 6, 2005;

U.S. patent application Ser. No. 11/295,755, entitled, "ERASING NON-VOLATILE MEMORY UTILIZING CHANGING WORD LINE CONDITIONS TO COMPENSATE FOR SLOWER ERASING MEMORY CELLS," by Masaaki Higashitani, filed Dec. 6, 2005; and U.S. patent application Ser. No. 11/296,032, entitled, "SYSTEMS FOR ERASING NON-VOLATILE MEMORY UTILIZING CHANGING WORD LINE CONDITIONS TO COMPENSATE FOR SLOWER ERASING MEMORY CELLS," by Masaaki Higashitani, filed Dec. 6, 2005.

BACKGROUND OF THE INVENTION

1. Field of the Invention

The present disclosure relates generally to semiconductor technology for erasing non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors or gates and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by one select gate (e.g. select gate 230 and select gate 250). A selection line SGS is used to control the source side select gates. The various NAND strings are connected to respective bit lines by select gates 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00."

Relevant examples of NAND type flash memories and their operation are provided in the following U.S. patents/patent applications, all of which are incorporated herein by reference: U.S. Pat. No 5,570,315; U.S. Pat. No. 5,774,397, U.S. Pat. No. 6,046,935, U.S. Pat. No. 6,456,528 and U.S. patent application. Ser. No. 09/893,277 (Publication No. US2003/0002348).

When programming a flash memory cell, a program voltage is applied to the control gate (via a selected word line) and the bit line is grounded. Electrons from the p-well are injected into the floating gate. When electrons accumulate in the floating gate, the floating gate becomes negatively charged and the threshold voltage of the cell is raised. The floating gate charge and threshold voltage of the cell can be indicative of a particular state corresponding to stored data.

In order to erase memory cells of a NAND type flash memory, electrons are transferred from the floating gate of each memory cell to the well region and substrate. Typically, one or more high voltage (e.g., ~16V-20V) erase pulses are applied to the well region to attract electrons away from the floating gate of each memory cell to the well region. The word lines of each memory cell are grounded or supplied with 0V to create a high potential across the tunnel oxide region to attract the electrons. If each memory cell of a NAND string is not erased after application of an erase voltage pulse, the size of the pulse can be increased and reapplied to the NAND string until each memory cell is erased. The amount by which the erase voltage is increased in between pulses is typically referred to as the step size for the erase voltage.

Typical erase operations using prior art techniques can lead to differing erase rates amongst memory cells in a NAND string. Some memory cells may reach a target threshold voltage level for an erased state faster or slower than others. This can lead to over-erasure of faster erasing memory cells because they will continue to be subjected to erase voltages that are applied to sufficiently erase the slower memory cells of the NAND string. Thus, the different erase rates can result in a shorter cycling life of a memory cell or NAND string. Typical erase operations can also lead to disparate threshold voltages among memory cells of a NAND string. That is, one or more memory cells of the NAND string may have a different threshold voltage after application of one or more erase voltage pulses when compared to other memory cells of the string or device. To overcome this effect, a technique generally referred to as soft programming has been used to adjust the threshold voltages of one or more memory cells after erasure. Soft programming includes applying a relatively low program voltage—lower than used for actual programming—to one or more memory cells. Soft programming typically includes applying a program voltage as a series of pulses that are increased by a step size in between each application of the program voltage pulses. Soft programming raises the memory cells' threshold voltages in order to narrow and/or raise the threshold voltage distribution of the population of erased memory cells. Soft programming, however, may increase program and erase times.

In addition, traditional soft programming can suffer from some of the same effects of disparate properties among different memory cells. The same memory cells that may be slow to erase, may also be slow to soft-program. These slower soft programming cells can have lower erased threshold voltages than other cells of the NAND string at the conclusion of soft programming.

SUMMARY OF THE INVENTION

Technology described herein pertains to technology for erasing non-volatile memory in a manner that can reduce or eliminate over-erasure of the storage elements of the memory array. The erase voltage pulses are structured so as to more accurately position the threshold voltage of erased storage elements near a reference level for verifying that the elements are erased.

The erase voltage applied to a set of non-volatile storage elements to be erased is controlled to more accurately shift the threshold voltage of the storage elements to a level corresponding to an erased state. The erase voltage is applied as a series of voltage pulses, when necessary, to shift the threshold voltage of to-be-erased memory cells below a verify level indicative of an erased condition. To avoid over-erasing the memory cells, the second erase voltage pulse is decreased, or not increased, in magnitude when compared to the previously applied voltage pulse. By decreasing or not increasing the size of the erase voltage, the amount of charge transferred from the cells by the second pulse is controlled to more accurately position an erased threshold voltage distribution for the cells near the verify level and thereby, avoid or reduce over-erasure. Subsequent erase voltage pulses are then increased in magnitude to provide further erasing when needed. Because the second pulse is not increased as with these additional pulses, over-erasure can be lessened during the period before the shift in charge reaches a steady-state level associated with the level of subsequent increases in magnitude.

A process for erasing non-volatile memory in one embodiment includes applying a first erase voltage pulse to a set of non-volatile storage elements, applying a second erase voltage pulse to the set of non-volatile storage elements after verifying that one or more non-volatile storage elements of the set are not sufficiently erased subsequent to application of the first erase voltage pulse, and applying a third erase voltage pulse to the set of non-volatile storage elements after verifying that one or more non-volatile storage elements of the set are not sufficiently erased subsequent to application of the second erase voltage pulse. The second erase voltage pulse has an equal or lesser magnitude than the first erase voltage pulse and the third erase voltage pulse has a greater magnitude than the second erase voltage pulse.

To erase a set of non-volatile storage elements, one embodiment can include applying an erase voltage to the set at a first level, verifying whether the set of storage elements is erased after applying the erase voltage, applying the erase voltage to the set at a second level that is less than the first level if the set is not verified as erased after applying the erase voltage at the first level, verifying whether the set is erased after applying the erase voltage at the second level, and applying the erase voltage to the set at a third level that is greater than the second level if the set is not verified as erased after applying the erase voltage at the second level.

One exemplary implementation includes a set of non-volatile storage elements and one or more managing circuits in communication with the set of non-volatile storage elements. The one or more managing circuits can perform the processes described above.

Other features, aspects, and objects of the invention can be obtained from a review of the specification, the figures, and the claims.

BRIEF DESCRIPTION OF THE DRAWINGS

FIG. 20 is a table depicting bias conditions for erasing and verifying erasure of a set of non-volatile storage elements according to one embodiment of the present disclosure.

FIG. 23 is a flowchart for performing step 616 of FIG. 19 in accordance with one embodiment.

FIG. 26 is a table depicting bias conditions for soft programming and verifying soft programming of a set of non-volatile storage elements according to one embodiment of the present disclosure.

DETAILED DESCRIPTION

Figure 4:
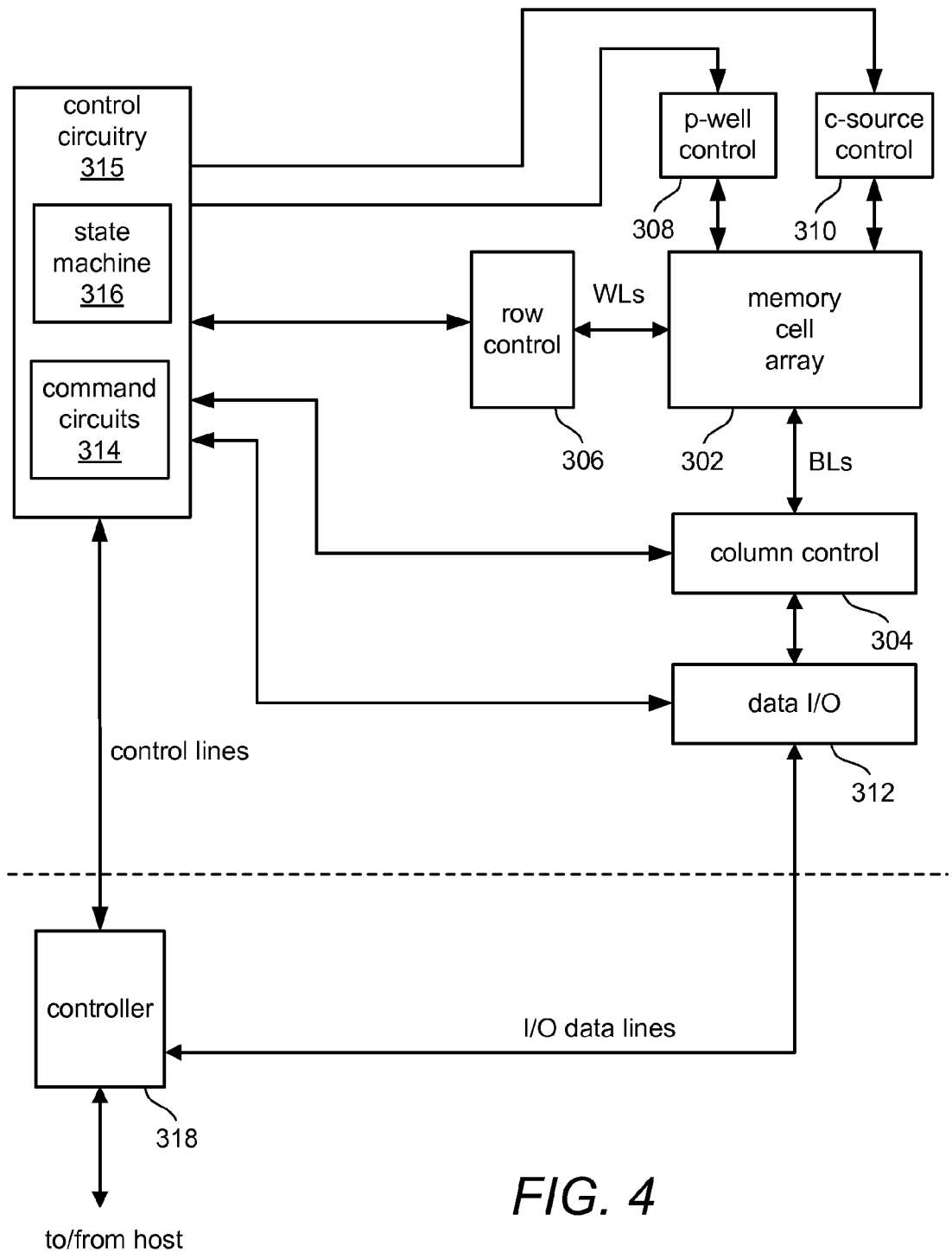
FIG. 4 is a block diagram of one embodiment of a non-volatile memory system in which the various aspects of the present invention can be implemented.

FIG. 4 is a block diagram of one embodiment of a flash memory system that can be used to implement one or more embodiments of the present disclosure. Other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 5:
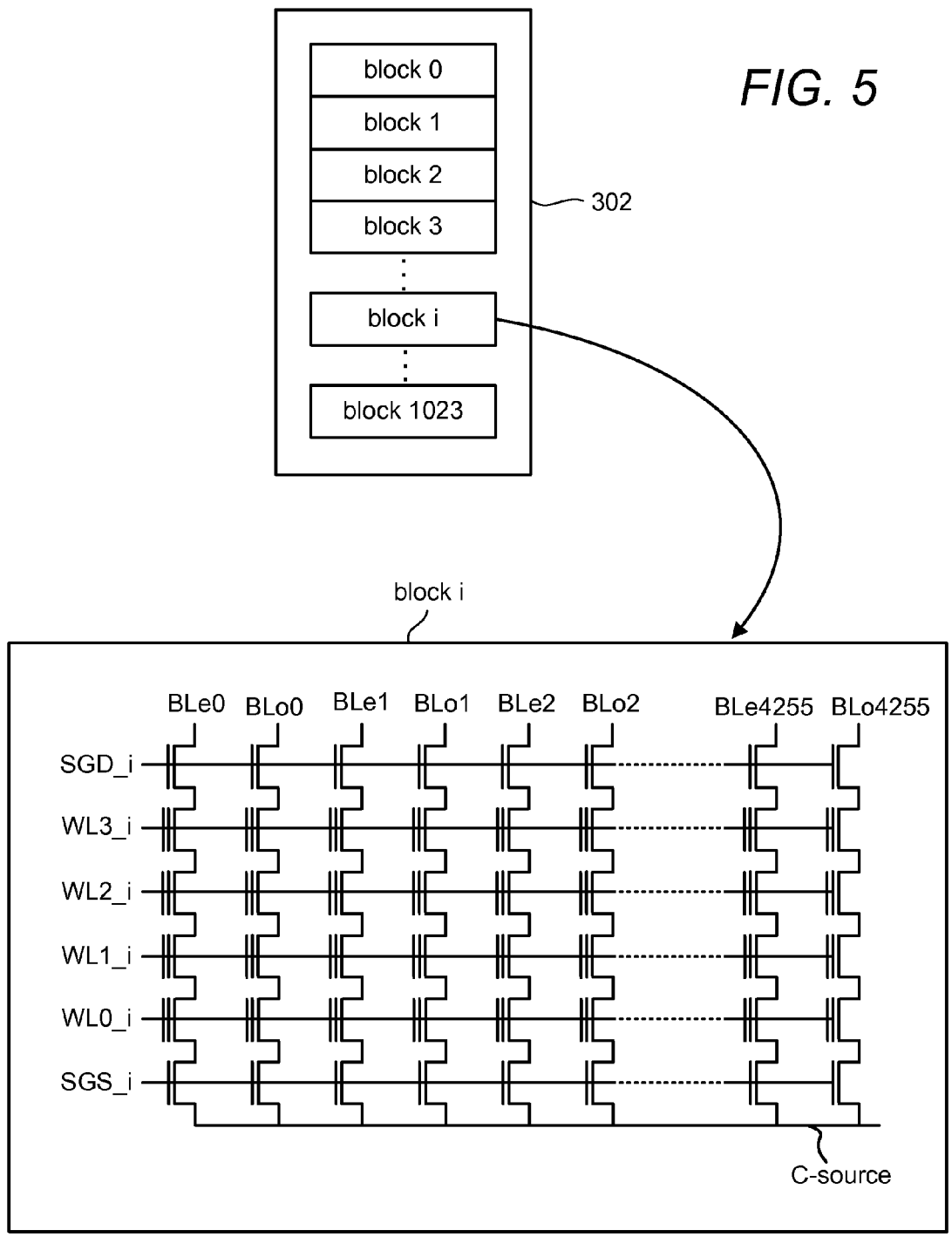
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 5 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS).

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments. Additionally, architectures other than that of FIGS. 4 and 5 can also be used to implement embodiments.

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0V while the control gate receives a series of programming pulses with increasing magnitudes. In one embodiment, the magnitudes of the pulses in the series range from 12V to 24V. In other embodiments, the range of pulses in the series can be different, for example, having a starting level of higher than 12V. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 2.5V) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 6:
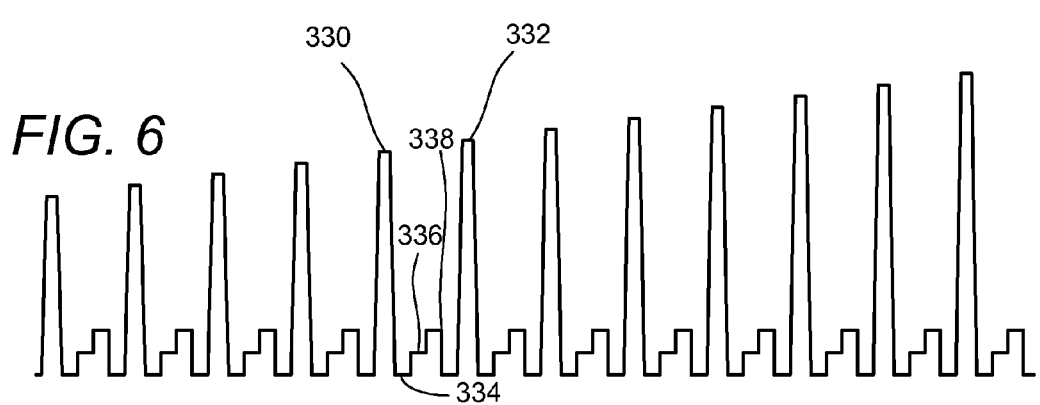
FIG. 6 depicts an exemplary program/verify voltage signal that can be applied to a selected word line in accordance with embodiments.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2V (or 0.4V). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Method for Programming of Multi-State Non-Volatile Memory Using Smart Verify, filed Oct. 27, 2005; and U.S. patent application Ser. No. 11/260,658, entitled "Apparatus for Programming of Multi-State Non-Volatile Memory Using Smart Verify," filed Oct. 27, 2005, all of which are incorporated herein by reference in their entirety.

The read and verify operations described above are performed according to techniques known in the art. Thus, many of the details explained can be varied by one skilled in the art.

Figure 7:
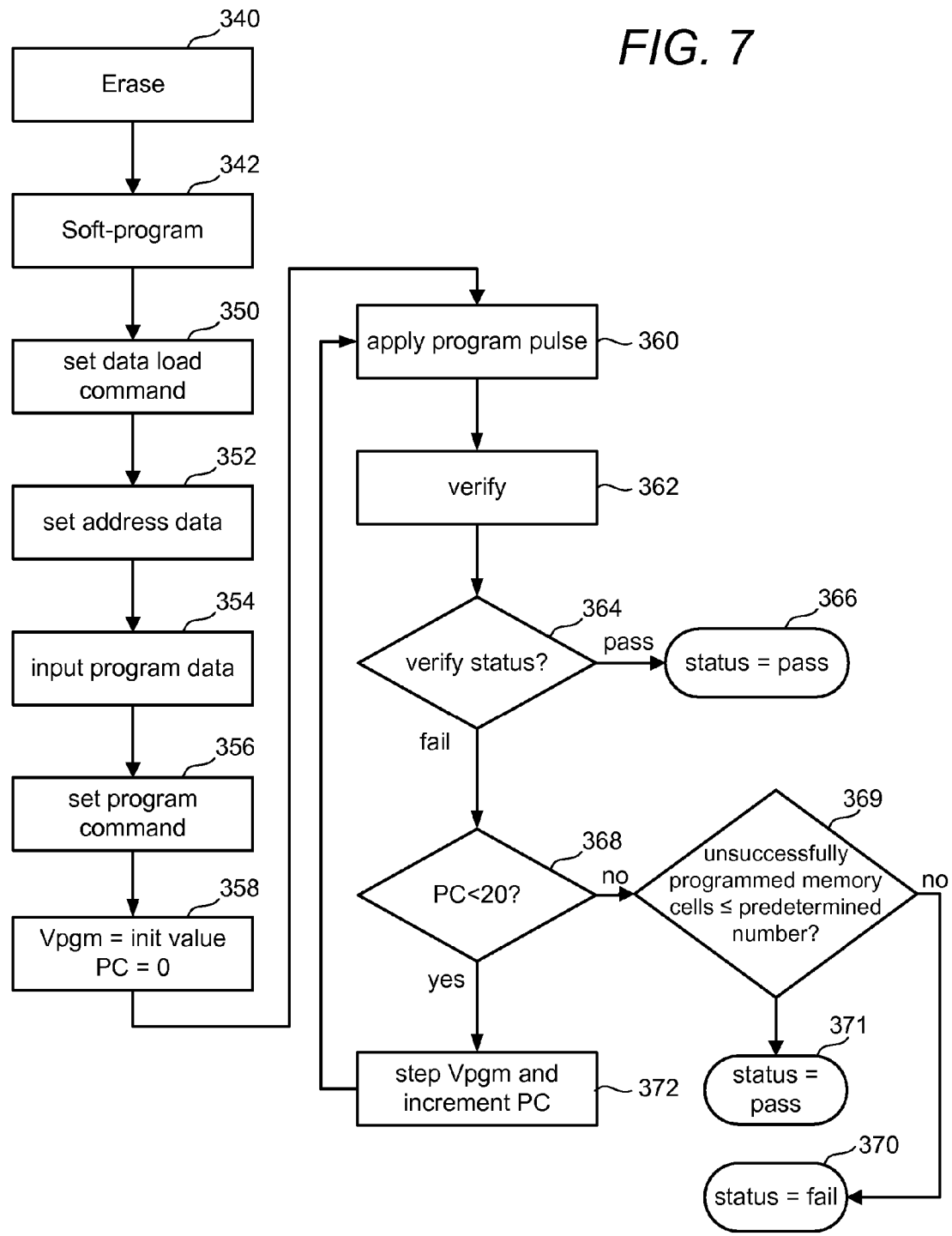
FIG. 7 is an exemplary flowchart for performing a program operation.

FIG. 7 is a flow chart describing one embodiment of a method for programming non-volatile memory. The memory cells to be programmed are erased at step 340. Step 340 can include erasing more memory cells than those to be programmed (e.g., in blocks or other units). At step 342, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 350 of FIG. 7, a "data load" command is issued by controller 318 and input to command circuits 314, allowing data to be input to data input/output buffer 312. The input data is recognized as a command and latched by state machine 316 via a command latch signal, not illustrated, input to command circuits 314. At step 352, address data designating the page address is input to row controller or decoder 306 from the controller or host. The input data is recognized as the page address and latched via state machine 316, affected by the address latch signal input to command circuits 314. At step 354, a page of program data for the addressed page is input to data input/output buffer 312 for programming. For example, 532 bytes of data could be input in one embodiment. That data is latched in the appropriate registers for the selected bit lines. In some embodiments, the data is also latched in a second register for the selected bit lines to be used for verify operations. At step 356, a "program" command is issued by the controller and input to data input/output buffer 312. The command is latched by state machine 316 via the command latch signal input to command circuits 314.

Triggered by the "program" command, the data latched in step 354 will be programmed into the selected memory cells controlled by state machine 316 using the stepped pulses of FIG. 6 applied to the appropriate word line. At step 358, Vpgm, the programming pulse voltage level applied to the selected word line, is initialized to the starting pulse (e.g., 12V) and a program counter PC maintained by state machine 316 is initialized at 0. At step 360, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 362, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 364, it is checked whether all of the data latches are storing logic "1." If so, the programming process is complete and successful because all selected memory cells were programmed and verified to their target states. A status of "PASS" is reported at step 366.

If, at step 364, it is determined that not all of the data latches are storing logic "1," then the programming process continues. At step 368, the program counter PC is checked against a program limit value. One example of a program limit value is 20, however, other values can be used in various implementations. If the program counter PC is not less than 20, then it is determined at step 369 whether the number of bits that have not been successfully programmed is equal to or less than a predetermined number. If the number of unsuccessfully programmed bits is equal to or less than the predetermined number, then the programming process is flagged as passed and a status of pass is reported at step 371. The bits that are not successfully programmed can be corrected using error correction during the read process. If however, the number of unsuccessfully programmed bits is greater than the predetermined number, the program process is flagged as failed and a status of fail is reported at step 370. If the program counter PC is less than 20, then the Vpgm level is increased by the step size and the program counter PC is incremented at step 372. After step 372, the process loops back to step 360 to apply the next Vpgm pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 358-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8:
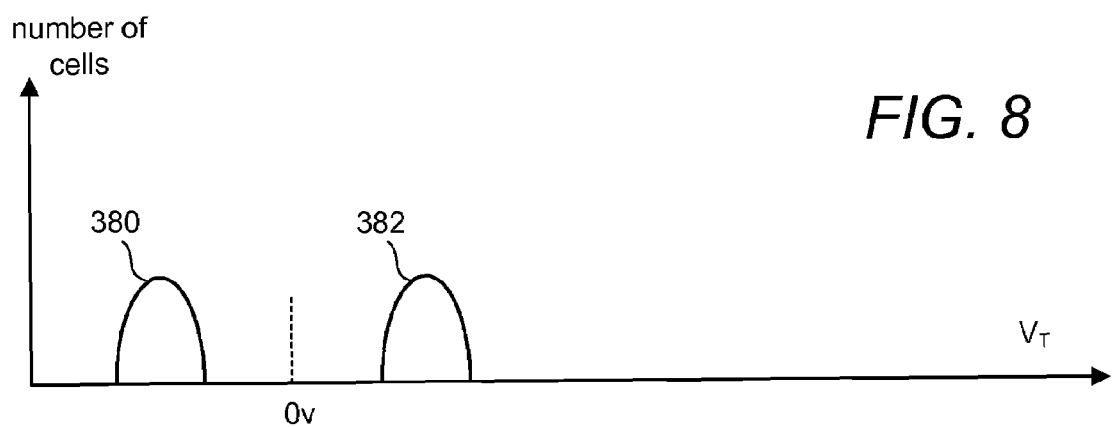
FIG. 8 depicts exemplary threshold distributions of a group of memory cells.

At the end of a successful program process, the threshold voltages of the memory cells should be within one or more distributions of threshold voltages for programmed memory cells or within a distribution of threshold voltages for erased memory cells. FIG. 8 illustrates threshold voltage distributions for a memory cell array when each memory cell stores one bit of data. FIG. 8 shows a first distribution 380 of threshold voltages for erased memory cells and a second distribution 382 of threshold voltages for programmed memory cells. In one embodiment, the threshold voltage levels in the first distribution 380 are negative and correspond to logic "1"

while the threshold voltage levels in the second distribution 382 are positive and correspond to logic "0."

Figure 9:
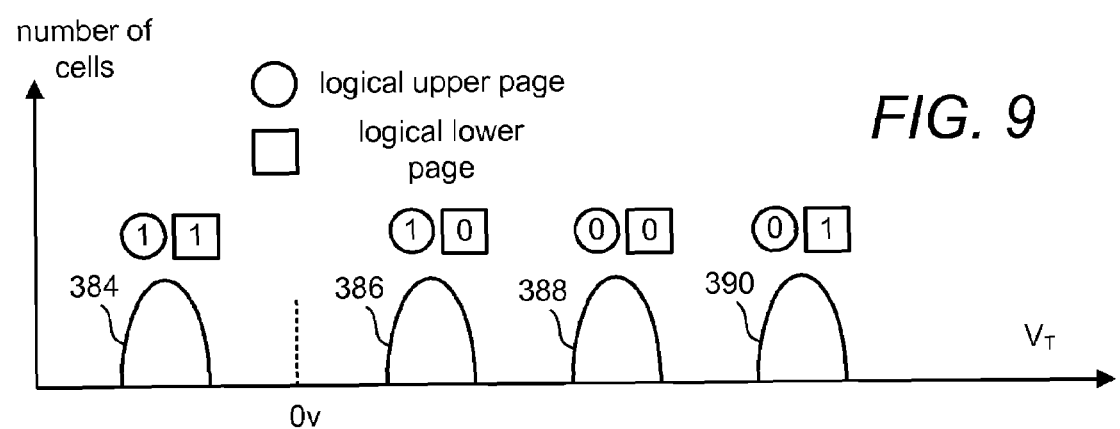
FIG. 9 depicts exemplary threshold distributions of a group of memory cells storing two bits of data.

FIG. 9 illustrates exemplary threshold voltage distributions for a memory cell array when each memory cell stores two bits of data in four physical states. Distribution 384 represents a distribution of threshold voltages of cells that are in an erased state (storing "11"), having negative threshold voltage levels. Distribution 386 represents a distribution of threshold voltages of cells that are in a first programmed state, storing "10." Distribution 388 represents a distribution of threshold voltages of cells that are in a second programmed state, storing "00." Distribution 390 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Figure 1:
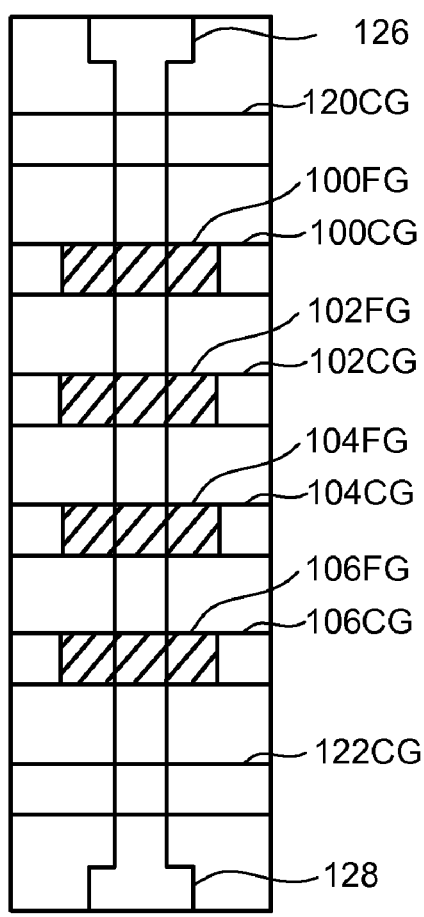
FIG. 1 is a top view of a NAND string.
Figure 2:
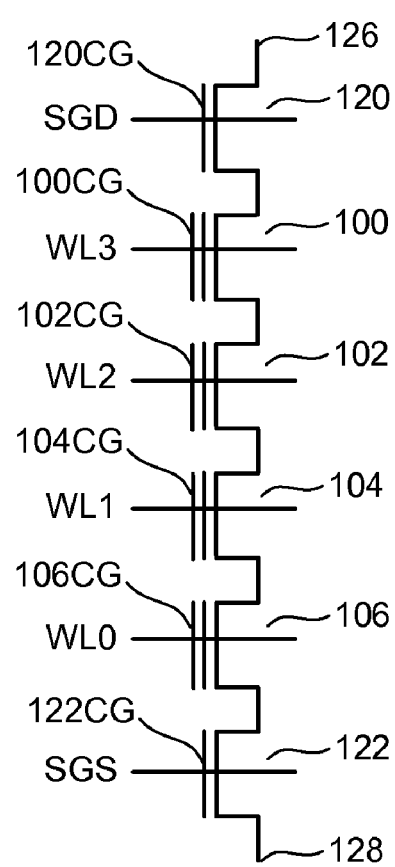
FIG. 2 is an equivalent circuit diagram of the NAND string depicted in FIG. 1.
Figure 3:
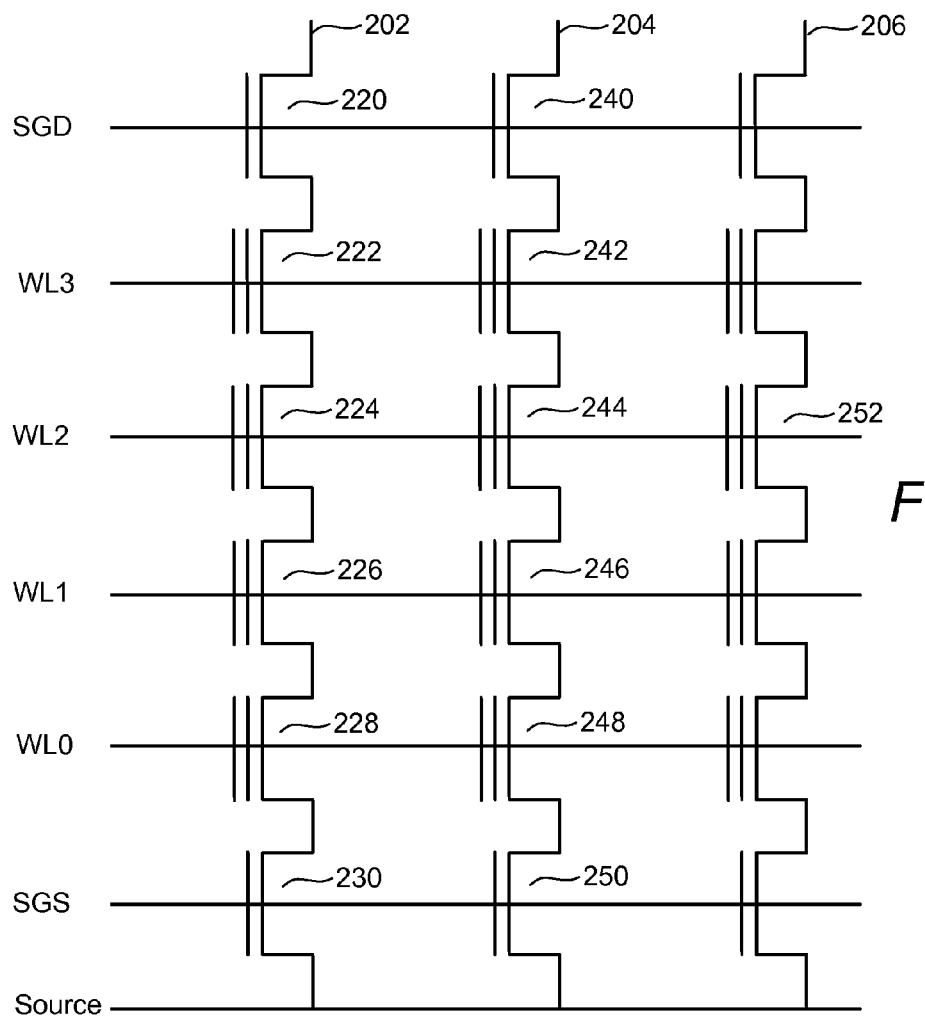
FIG. 3 is a circuit diagram depicting three NAND strings.

Normally, the cells being programmed in parallel are alternate ones along a word line. For example, FIG. 3 illustrates three memory cells 224, 244 and 252 of a much larger number of cells along one word line WL2. One set of alternate cells, including cells 224 and 252, store bits from logical pages 0 and 1 ("even pages"), while another set of alternate cells, including cell 244, store bits from logical pages 2 and 3 ("odd pages").

Figures 10, 11:
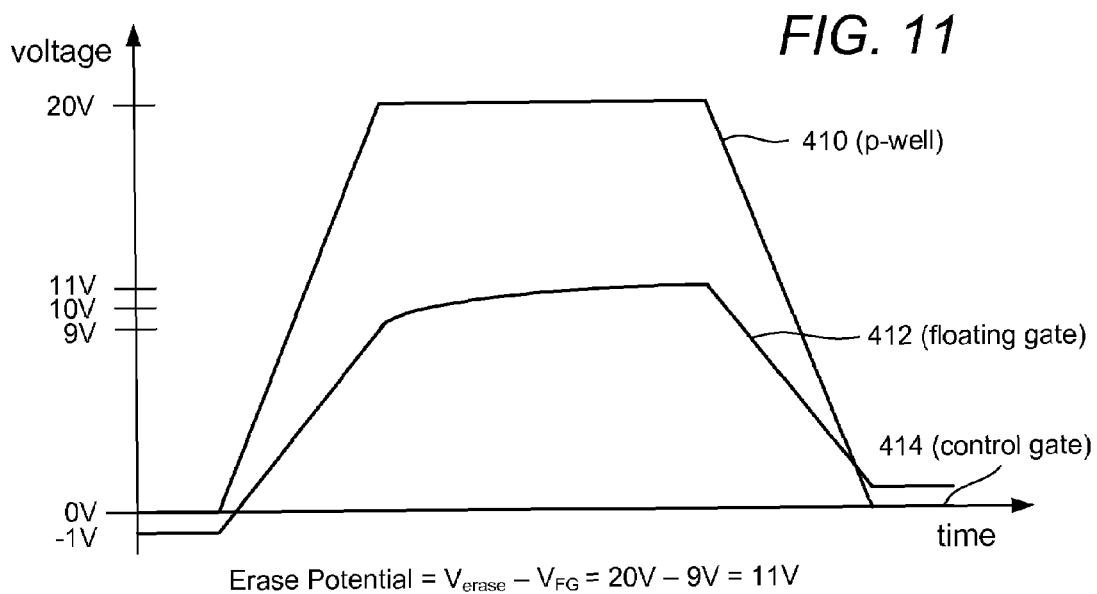
FIG. 10 is a table depicting exemplary bias conditions for performing an erase operation according to prior art techniques.
FIG. 11 is a graph depicting voltages at various portions of a NAND string during an ideal erase operation.

Memory cells are erased in one embodiment by raising the p-well to an erase voltage (e.g. 20V) and grounding or applying 0V to the word lines of a selected block while the source and bit lines are floating. FIG. 10 is a table 400 including exemplary bias conditions for performing an erase operation in column 402. Due to capacitive coupling, the unselected word lines (e.g., those in unselected, not to-be-erased blocks), bit lines, select lines, and c-source are also raised to a high positive potential (e.g., 20V). A strong electric field is thus applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its floating gate. As sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. Thus, erasing a memory cell refers to lowering the threshold voltage of a memory cell and does not imply complete or successful erasing thereof. Erasing can be performed on the entire memory array, one or more blocks of the array, or another unit of cells. The erase voltage signal $V_{erase}$ is typically applied as a series of erase voltage pulses, with an erase verification operation being carried out in between each pulse. If the unit of cells being erased is not verified as erased after application of an erase voltage pulse, another erase voltage pulse can be applied to the p-well region. In many memory structures, the peak value of the erase voltage is increased for each subsequent pulse (e.g., in 1V increments from 16V to 20V).

FIG. 11 is a graph depicting the voltage at various portions of a NAND string during application of a single erase voltage pulse for a typical erase operation (e.g., under the bias condition of FIG. 10). The example of FIG. 11 illustrates an ideal case, ignoring inter-gate capacitive charge coupling as discussed below. Curve 410 depicts the voltage of the p-well region which receives erase voltage signal $V_{erase}$. The erase voltage pulse causes the p-well to ramp up to 20V and then back to 0V. Curves 414 and 412 depict the control gate voltage and floating gate voltage of a memory cell of the string. Before the erase voltage pulse is applied, the floating gate voltage depends on the programmed state of the memory cell and is typically lower than 0V. In FIG. 11, a value of −1V is assumed for the floating gate voltage before the first erase voltage pulse. The control gate voltage 414 remains at 0V throughout the erase operation while the floating gate voltage 412 rises in proportion to the p-well voltage. The floating gate is capacitively coupled across the tunnel dielectric region to the p-well. In many NAND string implementations, the capacitive coupling ratio between the floating gate of a memory cell and the p-well region is about 40-50%. Accordingly, floating gate voltage 412 rises in about a 0.5:1 ratio (when the coupling ratio is 50%) with the p-well voltage to a voltage of about 9V. The resulting erase potential, the potential between the cell's floating gate and the p-well region, is given below the graph of FIG. 11. The erase potential is equal to the difference between the p-well voltage ($V_{erase}$=20V) and the floating gate voltage ($V_{FG}$=9V). For the scenario depicted in FIG. 11, the erase potential is equal to about 11V at the beginning of the first erase voltage pulse. Note that the erase potential changes during the actual erase voltage pulse as electrons are transferred from the floating gate to the p-well. As a result, when the p-well returns to 0V after the erase voltage pulse, the floating gate voltage will be different than before the erase voltage pulse was applied. Typically, the floating gate voltage will be positive after the first erase voltage pulse, corresponding to a negative (erased) threshold voltage of the memory cell.

FIG. 10 also sets forth bias conditions for verifying a NAND string for an erased state in column 404. The bit line is floating while the source line is at $V_{DD}$. The drain select gate and source select gate lines are supplied with a positive voltage $V_{SG}$ that is sufficient to turn on both select gates. $V_{SG}$ is typically larger than $V_{DD}$. For example, $V_{SG}$ can be about 4.0V-4.5V in one embodiment. The word lines are provided with an erase verify voltage $E_{verify}$ (e.g., 0V) for the operation. To verify whether the memory cells of the string are erased, the bias conditions of column 404 are applied to the NAND string and the bit line voltage is sensed. If the memory cells are erased sufficiently deep, they will be in the on state and provide a conduction path from the source line to the bit line. A current will be induced through the NAND string and the bit line voltage will increase. After a predetermined amount of time the bit line voltage is sensed or checked by a sense amplifier. If the bit line voltage has reached a predetermined level, the memory cells are verified as erased. If the memory cells are not erased sufficiently deep, they will not be in the on state and therefore, will not conduct any current or will conduct too little current. As a result, the bit line voltage will not increase up to the predetermined level. When the bit line voltage is sensed after the predetermined amount of time, it will not have reached the predetermined level and the NAND string will not be verified as erased.

Figure 12A:
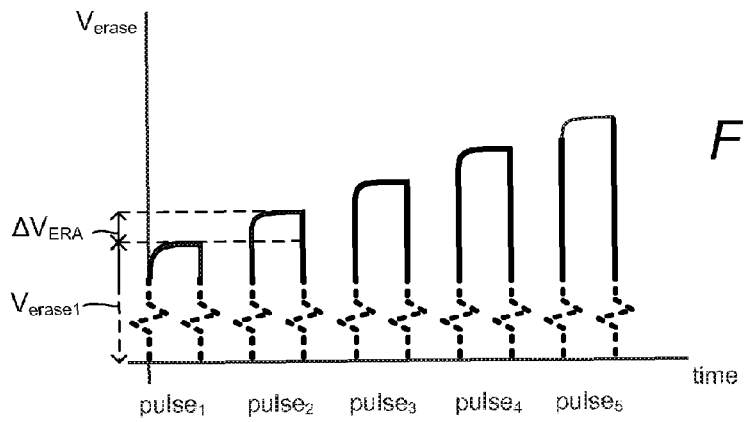
FIGS. 12A-12C depict a traditional erase voltage signal, the threshold voltage of an exemplary memory cell subjected to the erase voltage signal, and a distribution of threshold voltages for a set of memory cells subjected to the erase voltage signal.

FIG. 12A depicts a typical erase voltage signal $V_{erase}$ as may be applied to erase a set of memory cells such as a block of cells in a flash memory array. The positive potential created by application of the erase voltage removes charge from the floating gates of the selected memory cells. Often the erase voltage signal includes a series of erase voltage pulses that are incremented by a step size $\Delta V_{ERA}$ over the magnitude of the previously applied erase voltage pulse. In many implementations, the starting level for the first pulse of the erase voltage is chosen so that after many write/erase cycles (the repetitive process of adding and removing charge from the storage elements as part of end-user write and erase operations) most or all blocks of the memory array can still be erased with application of a single erase voltage pulse. This often results in the erase voltage being set to a value much higher than actually needed (e.g., 1.5V higher than needed). In other embodiments, the first erase voltage pulse may be chosen such that only before write/erase cycling or only during a limited number of write/erase cycles, the memory cells will be erased after application of the first pulse. After extended write/erase cycling, more pulses may be needed. This technique can reduce the occurrence of over-erase at the beginning of write/erase cycling at the expense of more erase voltage pulses after extended write/erase cycling.

Large erase voltage pulses can result in considerable over-erasure of the memory cells. Over-erasing memory cells may negatively impact memory cell reliability as more charge than is needed is transported through the tunnel dielectric layer. Increases in the amount of transported charge can lead to increases in the amount of charge unintentionally trapped in the tunnel dielectric layer over time, leading to reliability issues with the affected memory cells. Over-erased memory cells can also lead to disturb issues (the unintentional programming of unselected memory cells) during programming operations. Over-erased memory cells may lead to insufficient boosting in an unselected NAND string by causing the boosted potential of the NAND string to leak due to over-erased memory cells unintentionally being in an on-state.

As shown in FIG. 12A, the erase voltage is incremented by step size $\Delta_{VERA}$ for each pulse after the first pulse pulse$_1$. Even though many implementations will select the first pulse level so as to erase most blocks of memory cells with one pulse after write/erase cycling, multiple pulses may still be required. For instance, numerous write/erase cycles may result in cells that require multiple pulses to remove a sufficient amount of charge from their floating gate region to result in adequate erasure. Other factors including natural variations between manufactured cells can also lead to certain cells that will require multiple pulses to be adequately erased, possibly before as well as after repeated write/erase cycling. An erase voltage signal like that depicted in FIG. 12A that utilizes sequentially increasing erase pulses may lead to further over-erasure of memory cells, in addition to that caused by a large magnitude for the first erase voltage pulse.

Figure 12B:
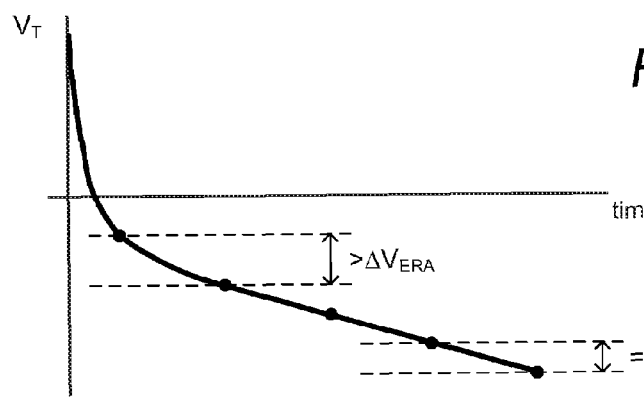

FIG. 12B is a graph illustrating the shift in threshold voltage of a typical memory cell that is subjected to multiple erase voltage pulses like those shown in FIG. 12A. The memory exemplary cell begins with a programmed threshold voltage (e.g., 4V). The memory cell is then subjected to the first erase voltage pulse, pulse$_1$. The first erase voltage pulse causes a large negative shift in the threshold voltage of the memory cell as a large portion of the stored charge is removed. The memory cell is next subjected to a second erase voltage pulse,
pulse$_2$, that is larger than pulse$_1$ by a step size $\Delta_{VERA}$ (e.g., 1V). The threshold voltage of the memory cell again shifts by a large amount. As illustrated, the decrease in the threshold voltage is larger than the increase ($\Delta_{VERA}$) in the erase voltage pulse size. After the application of several (e.g., 3 or 4) erase voltage pulses, the shift in threshold voltage for the memory cell will reach a steady-state condition. Subsequent decreases in the threshold voltage are approximately equal to the step size $\Delta_{VERA}$ by which the erase voltage pulse is increased in magnitude. Thus, the first few erase voltage pulses result in a threshold voltage shift that is larger than the erase voltage step size $\Delta_{VERA}$. The large shifts resulting from application of the first few pulses may shift the threshold voltage to a level that is deeper (more negative) than the verify level $E_{verify}$ by an amount greater than the step size $\Delta_{VERA}$. For instance, a step size of 1V might result in some memory cells having an erased threshold voltage that is more than 1V below the erase verify level $E_{verify}$.

Figure 12C:
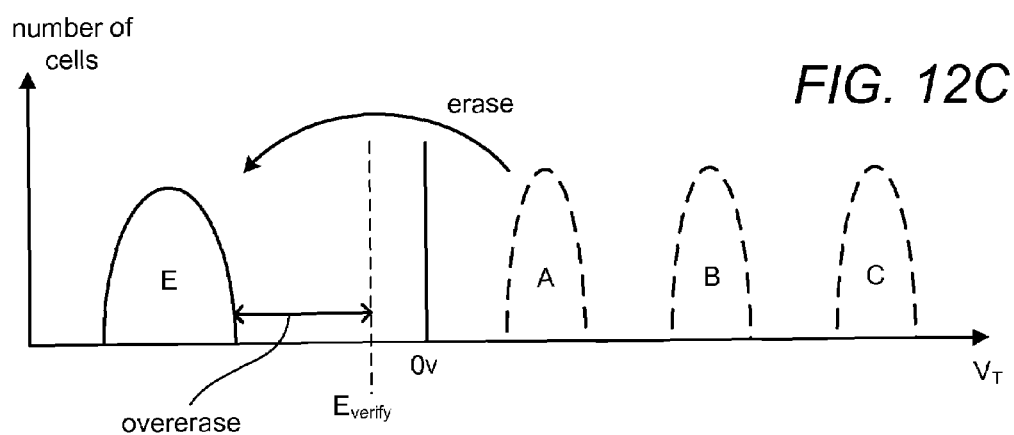

FIG. 12C depicts the threshold voltage distribution for a set of erased memory cells, illustrating the possible effects of using an erase voltage signal that is comprised of a series of pulses, each increased over the level of the preceding pulse by a selected step size. No cells remain in the programmed threshold voltage distributions A, B, and C as a result of erasing. It should be noted that a small number of cells may appear in the programmed distributions in embodiments that may verify erasure when less than all cells (e.g., a predetermined number of NAND strings) are fully erased. The threshold voltage of each programmed cell has been shifted to within erased threshold voltage distribution E. As FIG. 12C illustrates, the upper end of the erased threshold voltage distribution is shifted below the erase verify level $E_{verify}$ by a significant amount. The amount by which the upper end of the distribution is below the $E_{verify}$ level represents an overerase of the erased memory cells. It is desired as a result of erasing that the memory cells have a threshold voltage distribution that is as close as possible to the $E_{verify}$ level. In this case however, the threshold voltage of the memory cells is well below the $E_{verify}$ level.

Figure 13A:
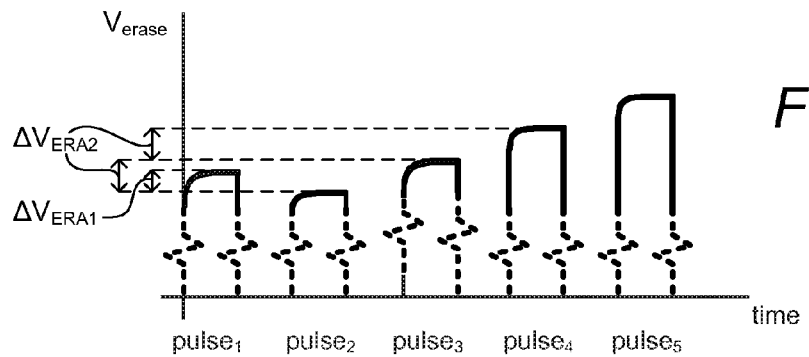
FIGS. 13A-13C depict an erase voltage signal in accordance with one embodiment of the present disclosure, the threshold voltage of an exemplary memory cell subjected to the erase voltage signal, and a distribution of threshold voltages for a set of memory cells subjected to the erase voltage signal.

FIG. 13A depicts an erase voltage signal in accordance with an embodiment of the present disclosure. A first erase voltage pulse, pulse$_1$, is applied at voltage level $V_{erase1}$. The size of the first erase voltage pulse can vary by embodiment according to the particular requirements of a given implementation. For instance, the size of the first pulse might be between 14V and 18V in many implementations, although voltage levels outside this range may also be appropriate for other implementations.

The second erase voltage pulse, pulse$_2$, is decreased in magnitude from that of the first pulse, pulse$_1$. Specifically, the second erase voltage pulse is decremented in magnitude by an amount $\Delta_{VERA1}$. The second erase voltage pulse may be applied to the selected set of memory cells if all or a predetermined number of subsets of cells (e.g., NAND strings) are not verified as erased during a verification operation performed after application of the first erase voltage pulse, pulse$_1$. If further erase voltage pulses are required, they will be increased in magnitude over the preceding pulse by an amount $\Delta_{VERA2}$, as shown for pulse$_3$, pulse$_4$ and pulse$_5$. By decreasing the size of the erase voltage from that of the first pulse, the shift in threshold voltage for the cells being erased can be reduced from that seen when a larger pulse is applied after the first pulse. Thus, it is possible to more accurately control the shift in threshold voltage that results from application of multiple erase voltage pulses. As a consequence, the erased threshold voltage distribution for a set of memory cells can be more accurately positioned near the $E_{verify}$ level.

Figure 13B:
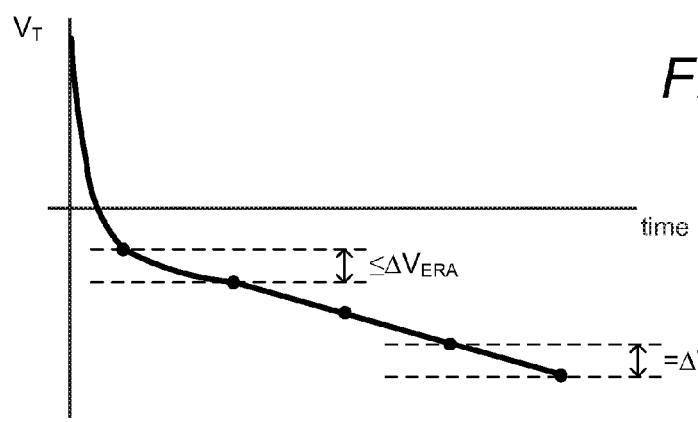

FIG. 13B depicts the threshold voltage of an exemplary memory cell that is subjected to the erase voltage signal depicted in FIG. 13A. The memory cell begins with a programmed threshold voltage (e.g., 4V). After application of the first erase voltage pulse, pulse$_1$, the threshold voltage of the memory cell shifts by a large negative amount as in FIG. 12B. The shift in threshold voltage that results from application of the second pulse, however, is much smaller. Notably, the shift is less than or equal to the step size $\Delta_{VERA2}$ that is used to increment the remaining pulses. This should be contrasted with the large shift that results from application of an increased second pulse as shown in FIG. 12B. In that case, the shift was greater than the step size $\Delta_{VERA}$ used for increasing each subsequent pulse.

The relative values of $\Delta_{VERA1}$ and $\Delta_{VERA2}$ may vary by embodiment. For instance, $\Delta_{VERA1}$ may be equal to $\Delta_{VERA2}$ in one embodiment. In such a case, the second pulse will be decreased from the first pulse by an amount equal to subsequent increases in the erase voltage for the third pulse, fourth pulse, etc. In other embodiments, $\Delta_{VERA1}$ may be smaller than $\Delta_{VERA2}$ so as to achieve a larger shift in threshold voltage for the second pulse than would be achieved by using the same step size for both incrementing and decrementing the erase voltage size. Although a larger shift would be realized, it will still be smaller than that achieved by increasing the size of the second pulse relative to the first pulse. It is also possible to utilize a $\Delta_{VERA1}$ that is larger than $\Delta_{VERA2}$ to achieve an even smaller shift in threshold voltage from application of the second erase voltage pulse. The value of $\Delta_{VERA2}$ used for incrementing subsequent pulses may be equal to or different than the traditional step size $\Delta_{VERA}$ as shown in FIG. 12A. In one exemplary embodiment, $\Delta_{VERA1}$ is about 0.5V while $\Delta_{VERA2}$ is about 1.0V. In another embodiment, $\Delta_{VERA1}$ can be about 1.0V while $\Delta_{VERA2}$ is about 0.5V. Step sizes of 1.0V or 0.5V might be used for both $\Delta_{VERA1}$ and $\Delta_{VERA2}$ in another embodiment. The actual values selected for the various step sizes can be selected by modeling a memory device or characterizing one or more memory devices during the manufacturing process. In one embodiment, each memory array has individual values of $\Delta_{VERA1}$ and $\Delta_{VERA2}$ set by characterizing the memory array during manufacturing. Various tests can be performed to select the optimal values for the $\Delta_{VERA1}$ and $\Delta_{VERA2}$. Similarly, the starting value Verase1 for the first erase voltage pulse can be selected by characterizing one or more memory devices.

Figure 14:
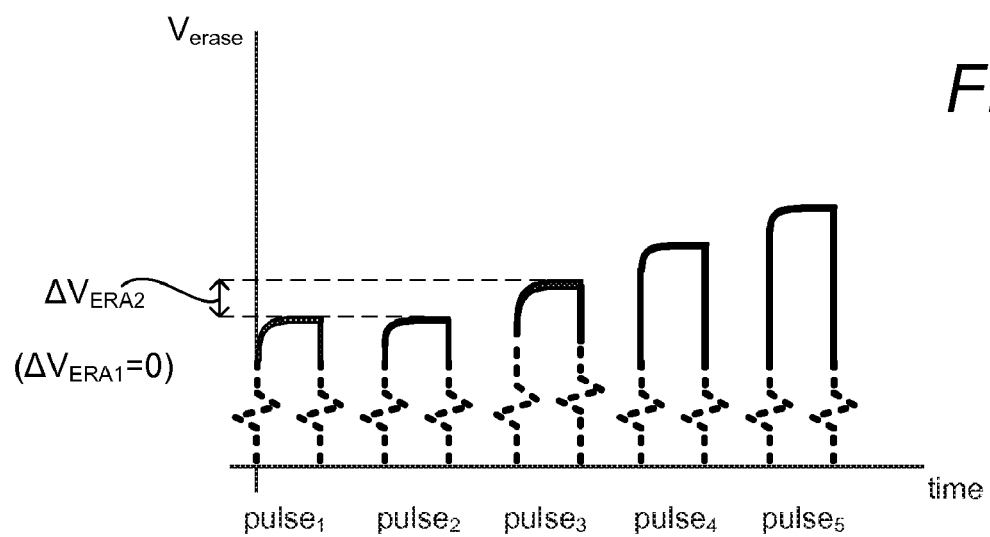
FIG. 14 depicts another erase voltage signal in accordance with one embodiment of the present disclosure.

It is also possible for $\Delta_{VERA\ 1}$ to be equal to zero, as illustrated in FIG. 14. In this embodiment, the amplitude of the second erase voltage pulse is equal to the amplitude of the first erase voltage pulse. By not increasing the second erase voltage pulse relative to the first erase voltage pulse, a decrease in the threshold voltage shift when compared to that of an increased second erase voltage pulse can still be achieved. Although the shift in threshold voltage will be larger than that seen from a decrease in the pulse size, the shift will still be less than that of traditional techniques using an increased second pulse size.

Figure 13C:
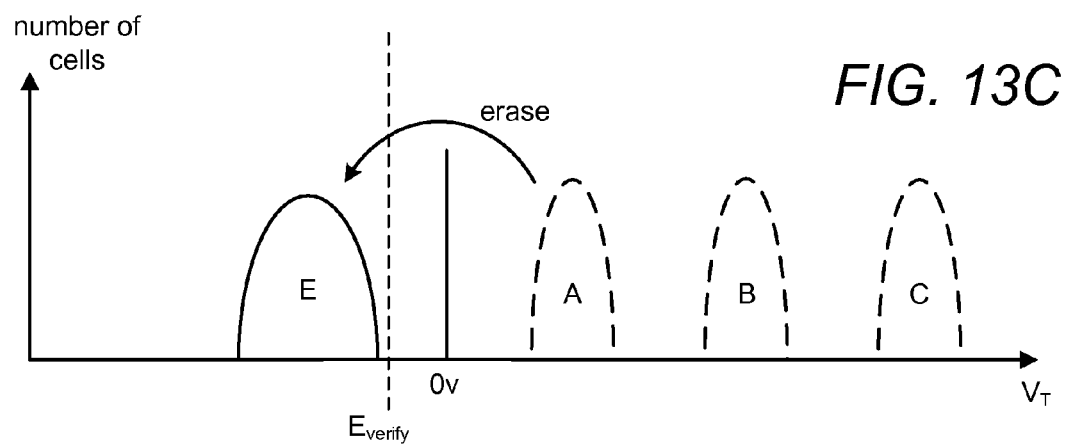

FIG. 13C depicts the threshold voltage distribution for a set of erased memory cells erased according to the technique illustrated in FIGS. 13A and 14. No, or almost no, cells remain in the programmed threshold voltage distributions A, B, and C as a result of erasing. The threshold voltages of each of these programmed cells have been shifted to within erased threshold voltage distribution E. In FIG. 13C, the upper end of the erased threshold voltage distribution is shifted to just below the erase verify level E$_{verify}$. Because a second pulse is applied to the memory cells at a level equal to or less than the first erase voltage pulse, overasure has been significantly reduced. The distribution of threshold voltage for erased memory cells is positioned at or near the desired level E$_{verify}$.

Figure 15:
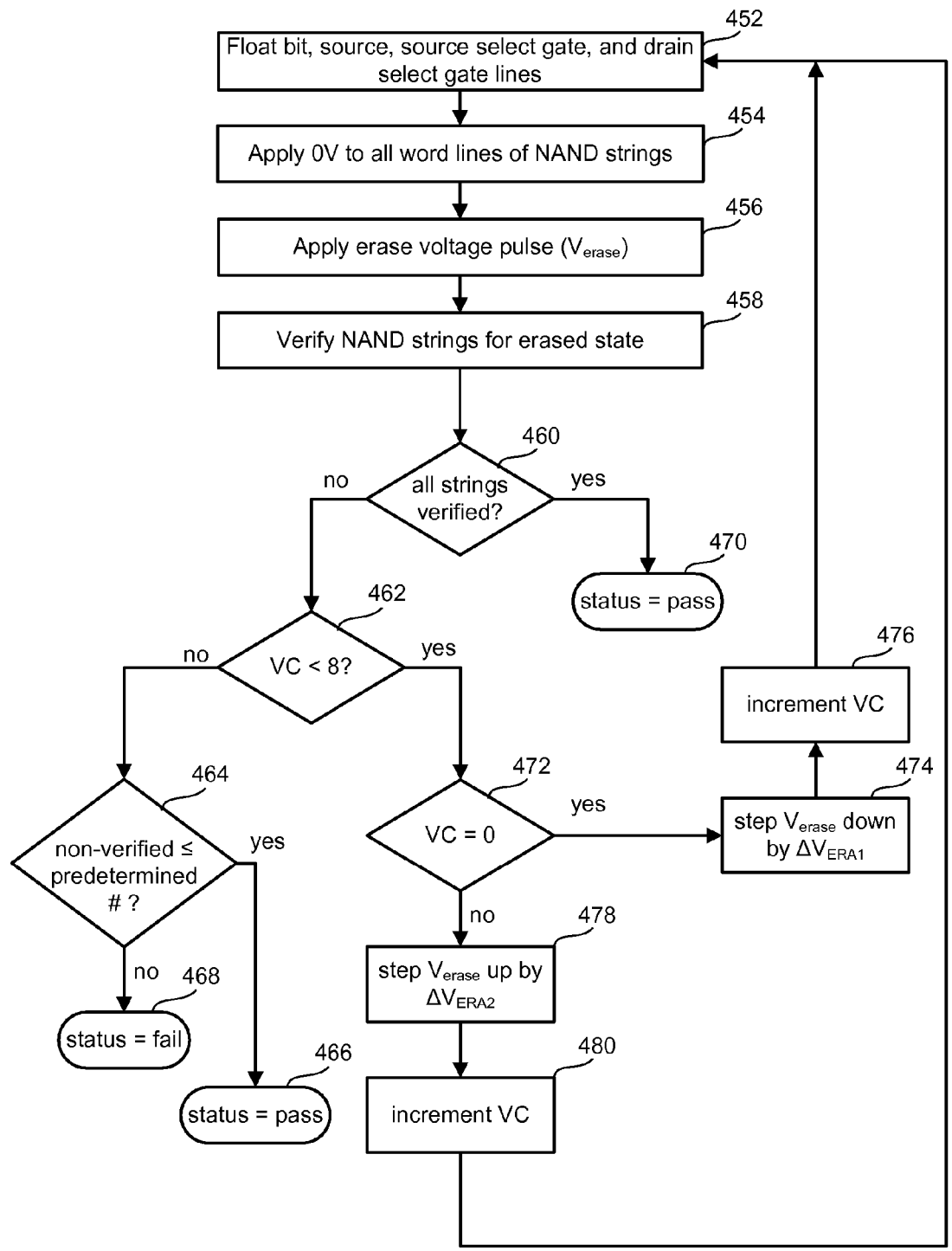
FIG. 15 is a flowchart for erasing a set of non-volatile storage elements in accordance with one embodiment of the present disclosure.

FIG. 15 is a flowchart depicting a process for erasing a set of storage elements, such as a block of flash memory cells, according to one embodiment of the present disclosure. Multiple NAND strings can be operated upon in parallel to erase a block of memory cells according to the method of FIG. 15. Other units of cells can also be operated upon in accordance with the described embodiments. An erase voltage signal such as that depicted in FIG. 13A or 14 that includes a second erase voltage pulse equal to or less than a first erase voltage pulse is used. In one embodiment, erasing according to the process of FIG. 15 can be performed for erase step 340 of FIG. 7. In one embodiment, erasing according to FIG. 15 is performed after controller 318 receives a request from the host to erase or program a set of memory cells.

The bit, source, source select gate, and drain select gate lines for each NAND string are floated at step 452. At step 454, 0V (or ground) is applied to each word line of the selected block or blocks. Steps 452 and 454 enable erasing of the NAND strings connected to a common set of word lines for the block. The erase voltage is applied to the p-well region for the selected NAND strings at step 456. Step 456 includes the application of a first erase voltage pulse as shown in FIG. 13A or 14. Different starting levels can be used for the first erase voltage pulse. At step 458, the individual NAND strings of the block or blocks that are selected for erase are verified for an erased condition. As illustrated in column 404 of FIG. 10, erase verification can be performed by applying the erase verify voltage (E$_{verify}$) to each word line, turning on the select gates of the string by setting SGS and SGD to Vsg, and applying a voltage such as V$_{DD}$ to the source line. After some predetermined period of time, the bit line voltage of each NAND string is sensed. If the threshold voltage of each memory cell of the string is less than 0V, the string will provide a conduction path from source line to bit line and the bit line voltage will rise in accordance with the threshold voltage of the erased memory cells. The lower the threshold voltage of the erased cells, the higher the bit line voltage will rise. If the bit line charges to some predetermined level indicative of each cell having a threshold voltage lower than the E$_{verify}$ level, the NAND string is determined to have been sufficiently erased. Step 458 can be performed on multiple NAND strings of the block in parallel.

At step 460, it is determined whether each NAND string was successfully verified at step 458 for an erased condition. In the embodiment as shown, step 460 checks if every NAND string of the block or other division of cells is successfully verified as erased. In another embodiment, step 460 can determine if a predetermined number of NAND strings are successfully verified as erased. By determining that the erase is successful based on a predetermined number of NAND strings rather than every NAND string, the verification process can stop before the maximum erase loop number is reached (step 462), This can avoid over-erasing NAND strings due to one or a small number of difficult to erase or defective NAND strings. If all or the predetermined number of NAND strings are successfully verified at step 460, the erase process is determined to have been successful and a status of pass is reported to the controller and/or host device at step 470.

If all or the predetermined number of NAND strings are not successfully verified at step 460, the erase process continues at step 462 where a verify counter VC is checked against an erase limit value. The verify counter can be initialized to zero when beginning the erase process. The counter is used to limit the number of iterations of the erase cycle. One example of an erase limit value is 8, however other values both above and below 8 can be used in other embodiments. If the verify counter VC is not less than the erase limit value, the process continues at step 464 where it's determined if the number of non-verified NAND strings is less than or equal to a predetermined number. If the number of non-verified strings is less than or equal to this number, the erase process is determined to have been successful despite the presence of strings that are not adequately erased. Techniques including error correction control or mapping out of non-erased strings can be employed to accommodate these strings. A status of pass is reported at step 466. If the number of non-verified strings is not less than or equal to the predetermined number, a status of fail is reported for the erase process at step 468.

Returning to step 462, the erase process continues to step 472 if the verify counter VC is below the erase limit value. A check is made at step 472 to determine if the verify counter is equal to zero. A counter value of zero indicates that the erase process is currently in its first iteration and has only applied a single erase voltage pulse. If it is determined at step 472 that the verify counter VC is equal to zero, the process continues at step 474. The erase voltage signal is stepped down or decremented at step 474 by step size $\Delta_{VERA1}$. As shown in FIG. 13A, step 474 causes the next erase voltage to be less than that applied during the first iteration of the erase process. In an alternate embodiment, step 474 does not increase or decrease the erase voltage signal such that the next erase voltage pulse is equal to the pulse applied during the previous iteration. This corresponds to the signal shown in FIG. 14. At step 476, the verify counter VC is incremented by 1 to indicate that the erase process is now on the second iteration for applying the erase voltage to the selected cells.

If the check at step 472 determines that the verify counter VC is not equal to 0, thus indicating that the erase process is currently on a second or later iteration of the erase process, the erase process continues to step 478. At step 478, the erase voltage is incremented or stepped up by step size $\Delta_{VERA2}$. Again, $\Delta_{VERA2}$ may be equal to, less than or greater than step size $\Delta_{VERA1}$. At step 480, the verify counter is incremented by 1.

After setting the magnitude of the erase voltage pulse for the next iteration of the erase process and incrementing the verify counter at step 476 or 480, the erase process returns to step 452 to bias the NAND string(s) for further erasing. At step 456, the next erase voltage pulse will be applied to the selected string(s) at the level set by step 474 or step 478. The iterative erase process will continue until a status of pass is reported at one of steps 470 and 466, or a status of fail is reported at step 468. The erase process can also end upon a predetermined number of NAND strings reaching the erased state as determined at step 460.

The techniques illustrated in FIGS. 13A-15 can provide a more reliable non-volatile memory device. Decreasing (or not increasing) the size of the second erase voltage pulse over the size of the first erase voltage pulse, can provide more accurate control of the threshold voltage shift of memory cells being erased. It is possible in such implementations to more accurately position the erased threshold voltage distribution of memory cells close to the verify level used to confirm adequate erasure of memory cells. By more accurately controlling the shift in threshold voltage, over-erasure of memory cells can be reduced or in some cases, eliminated.

Another benefit of this technique is the possible elimination of soft-programming operations that follow erasing. Soft-programming is often applied to memory cells that have been erased to move the threshold voltage of deeply or over-erased memory cells closer to verify level used as the reference point for deeming a cell to be erased. Because the threshold voltage shift of the memory cells is more controlled when a reduction or non-increase in the pulse size is used after the first erase voltage pulse, the threshold voltage distribution of a set of memory cells will initially be more accurately positioned close to the verify level. As such, soft programming to move over-erased cells closer to this level may not be necessary. Soft-programming operations are typically much slower operation than erase operations. As such, eliminating soft-programming can provide increased performance for a memory device in the form of decreased erase times. It is noted that the step size used for decrementing and/or incrementing the erase voltage can be set to lower values when compared to typically employed step sizes to achieve greater precision in positioning the threshold voltage of memory cells near the erase verify level. For instance, a step size of 1V may be used when increasing each subsequent erase voltage pulse in traditional operations. If soft-programming can be eliminated by decreasing or not increasing the size of the second erase voltage pulse when compared to the first pulse, a smaller step size (e.g., 0.5V) may be practically employed. The smaller step size may lead to a larger number of pulses being applied to fully erase the cells. Because the soft-programming operation is a slower process than erasing, however, the elimination of soft-programming coupled with a smaller step size can lead to a net reduction in the time for erasing the memory cells.

In one embodiment that does not utilize soft-programming, a pre-program pulse is used prior to applying the first erase voltage pulse during an erase operation. A pre-program pulse can be applied to avoid over-erasing memory cells that are never programmed between erase operations. The pre-program pulse can be a small programming pulse applied to move the unprogrammed memory cells to a higher threshold voltage. Once in a higher threshold voltage range, the erase voltages can be applied without shifting the cells into a deeply erased state.

The actual voltage levels within a NAND string will typically be different than described with respect to the ideal case depicted in FIG. 11. Because of capacitive charge coupling between neighboring floating gates and between select gates and neighboring floating gates, different memory cells of a NAND string may experience different erase potentials under application of the same erase bias conditions.

Figure 16:
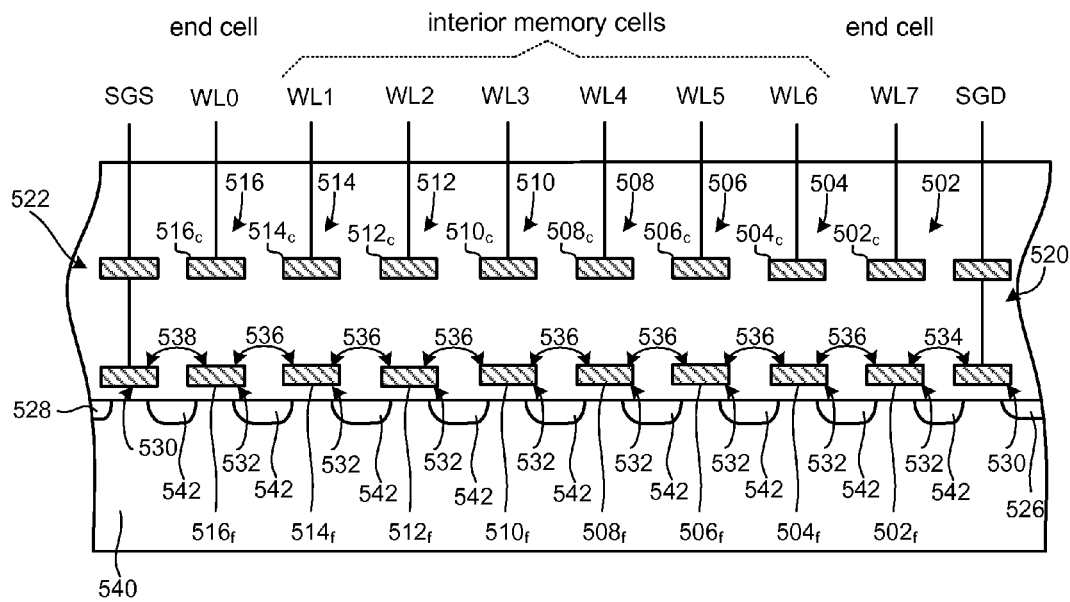
FIG. 16 is a cross sectional view of a NAND string depicting various capacitively coupled voltages within the NAND string.

FIG. 16 provides a cross-sectional view of a NAND string including 8 memory cells. Although embodiments are presented with respect to FIG. 16 and an 8 cell NAND structure, the present invention is not so limited and can be used in accordance with numerous NAND structures including fewer or more than 8 memory cells (e.g., 4, 12, 16, or more). As depicted in FIG. 16, the memory cells of the NAND string are formed in p-well region 540. Each memory cell (502, 504, 506, 508, 510, 512, 514, and 516) includes a stacked gate structure that consists of the control gate (502c, 504c, 506c, 508c, 510c, 512c, 514c, and 516c) and a floating gate (502f, 504f, 506f, 510f, 512f, 514f, and 516f). The floating gates are formed on the surface of the p-well on top of an oxide or other dielectric composite film. The control gate is above the floating gate, with an oxide or other isolating dielectric layer separating the control gate and floating gate. The control gates of the memory cells connect to or form word lines WL0, WL1, WL2, WL3, WL4, WL5, WL6, and WL7. N+ diffused regions 542 are shared between neighboring cells whereby the cells are connected to one another in series to form a NAND string. These N+ diffused regions form the source and drain of each of the cells. N+ diffused region 526 connects to the bit line for the NAND string, while N+ diffused region 528 connects to a common source line for multiple NAND strings. The select gates 520 and 522 are formed of the same structure as the memory cells, however, the gate regions are electrically connected.

Because of capacitive coupling, the floating select gates 522 and 520 are raised to a high positive potential when a high erase voltage is applied to the p-well during erase operations. The erase voltage applied to the p-well, or some portion thereof, couples from the well region to each of the select gates. About 90-100% of the p-well voltage can be expected to couple to each select gate in many NAND structures. Therefore, if an erase voltage pulse of 20V is applied to the p-well, the voltage on each select gate will rise about 18V-20V to a voltage of 18V-20V. In FIG. 16, the coupling from p-well 540 to select gates 522 and 520 is illustrated by arrows 530. Although to a lesser degree, a similar coupling effect is also experienced by each of the memory cells of the string. The coupling between the p-well and the floating gate of a memory cell is typically about 40-50%. Each floating gate is also coupled to its corresponding control gate with a coupling of about 50-60%. To a smaller extent, each floating gate is coupled to neighboring floating gates and control gates. All the different couplings add up to a total of 100%. Assuming a 50% coupling from p-well to floating gate, the floating gate voltage of each memory cell is raised about 10V under application of a 20V erase voltage pulse. This coupling effect is illustrated by arrows 532. The voltage coupled to each memory cell's floating gate effects the $V_{erase}$ potential created across the tunnel oxide layer. For example, an erase potential of about 11V (20V-9V) is created under application of a 20V erase voltage pulse to the p-well for a memory cell having a floating gate voltage of −1V prior to erasing.

Each memory cell of the string will experience some capacitive charge coupling from neighboring memory cells and/or transistors. This coupling can effect the potential of a cell's floating gate and consequently, the erase potential for the cell. The end memory cells (e.g., memory cells 502 and 516 in FIG. 16) of the NAND string—those connected to the first and last word lines (end word lines) of the NAND string and adjacent to the select gates of the NAND string—will experience capacitive charge coupling from the neighboring select gates. In FIG. 16, this capacitive coupling is depicted by arrow 534 from select gate 520 to floating gate 502*f* of memory cell 520 and by arrow 538 from select gate 522 to floating gate 516*f* of memory cell 516. The voltage coupled to memory cells 502 and 516 will decrease the electric field present across those cells' tunnel dielectric regions (e.g., tunnel oxide) in proportion to the amount of voltage at the respective select gate.

The coupling represented by arrows 538 and 534 occurs in both directions because during an erase operation, the select gates are in a floating state as well. As a result, the floating gate voltage of memory cells 516 and 502 will have some influence on the voltage on the select gates 522 and 520. However, the coupling from floating gate to select gate is much smaller than the coupling from the p-well to the select gates, and thus, the select gate voltage is determined almost completely by the p-well voltage.

In many NAND implementations, capacitive coupling from the select gates to the floating gates of the end memory cells of a NAND string can be expected to be on the order of about 2% to 5%. If an erase voltage of 20 volts is applied to the p-well region, each select gate's voltage will rise about 18V with 90% p-well to select gate coupling. Subsequently due to the 2-5% coupling from select gate to neighboring floating gate, the voltage on the neighboring floating gates (e.g., 516*f* and 502*f*) will rise about 0.4-1V. The resulting voltage across the tunnel oxide of the end memory cells of the string will be about 0.4 to 1V less than that for the ideal case shown in FIG. 11. Note that the above mentioned capacitive coupling can vary largely depending on the physical dimensions of the memory cells and select gates, the spacing between memory cells and select gates, and the dielectric properties of the materials used in constructing such components as the tunnel dielectric, dielectric between control and floating gates, and dielectric between select gates and memory cells. In some cases, for example, the above mentioned coupling may be larger or smaller than the above mentioned 2-5% range.

In addition to coupling between neighboring floating gates, another factor is coupling between the floating gate and neighboring word lines or control gates. This coupling may also be on the order of 2-5%, but may be smaller or larger depending on the dimensions and shape of the memory cells. In some cases, particularly where the physical distance between the select gates and neighboring memory cells is similar to the distance between two interior memory cells, the coupling from the select gate to the neighboring floating gate will be in a similar range as the coupling from a neighboring control gate (word line) and floating gate. During an erase operation, however, as the select gate is biased differently in comparison with the control gates and floating gates, the floating gate voltage of the end memory cells will be higher than that of the interior memory cells and thus, the erase potential will be lower for the end memory cells as hereinafter described.

Figure 17:
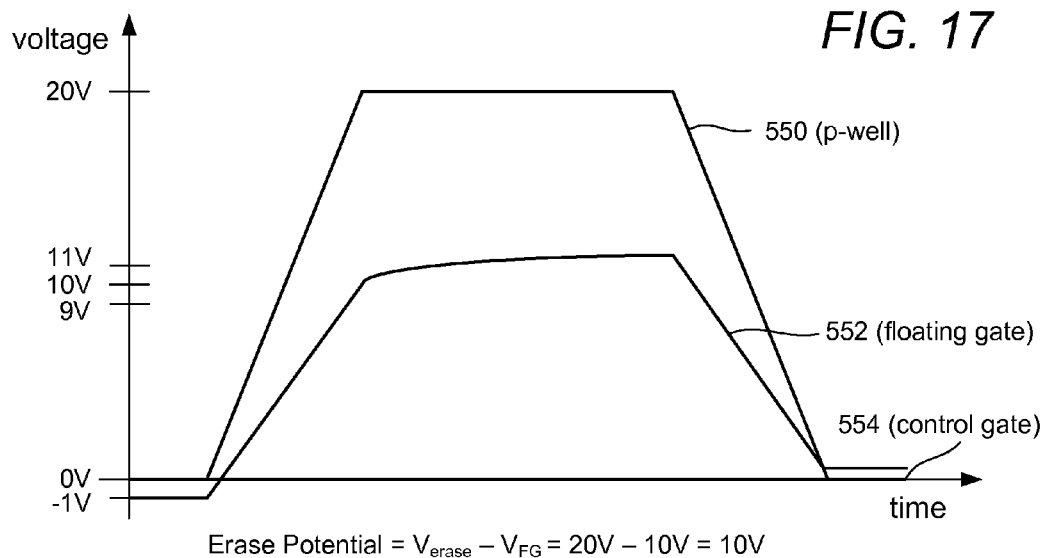
FIG. 17 is a graph depicting various voltages of the end memory cells of a NAND string during an erase operation.

FIG. 17 depicts the p-well voltage 550, floating gate voltage 552, and control gate voltage 554 for a typical end memory cell of a NAND string during application of a single erase voltage pulse for an erase operation under the bias conditions of FIG. 10. The p-well voltage 550 rises from 0V to a peak value of 20V and then back to 0V. The control gate voltage 554 remains at 0V since the word lines connected to each memory cell are supplied with 0V. As with all the cells, the floating gates of the end memory cells are capacitively coupled to the p-well region on the order of about 40-50%. As the p-well region voltage increases to 20V, this capacitive coupling causes the floating gate voltage to rise about 10V when 50% coupling is assumed. The end memory cells additionally have a portion of the voltage at the neighboring select gate coupled to them. Thus, the voltage on these floating gates will not only be increased in proportion with the p-well voltage that is capacitively coupled thereto, but will also be increased due to the 2-5% coupling from the select gates. In FIG. 17, it is assumed that the coupling from the select gates adds an additional 1V to the floating gate voltage. Accordingly, the floating gate voltage 552 rises to a maximum value of 10V at the beginning of the erase voltage pulse as opposed to the maximum value of 9V for the ideal case depicted in FIG. 11. The erase potential across the tunnel dielectric region for the end memory cells is given below the graph of FIG. 17. The erase potential at the beginning of the erase voltage pulse is about 10V, or about 1V less than the 11V erase potential for the ideal case.

The memory cells of a NAND string that are not adjacent to a select gate (i.e., all but the end memory cells of a NAND string) may be referred to herein as interior memory cells of the string. In FIG. 16, the interior memory cells of the NAND string are memory cells 504, 506, 508, 510, 512, and 514. Although the interior memory cells will experience capacitive coupling from neighboring floating gates that will decrease their erase potential (discussed hereinafter), it is of a lesser degree than that of the end memory cells. Thus, the interior memory cells will behave substantially as the ideal case described earlier and have an erase potential of about 11V (assuming that the cells were in a programmed state with a floating gate voltage of about −1V before the erase voltage pulse). Because of the lower potential across the tunnel oxide layers of the end memory cells compared to the interior memory cells, the end memory cells will erase slower and not be as deeply erased (will have fewer electrons transferred from their floating gates) as the interior memory cells after application of one or more erase voltage pulses.

Memory cells of a NAND string are verified as erased when the charge on the floating gate is above a predetermined level (threshold voltage below a predetermined level). Because of the additional coupling to the floating gates of the end memory cells, the overall time for an erase operation is increased in order to sufficiently erase these end memory cells. The interior memory cells may be sufficiently erased after application of a number N erase voltage pulses, while the end memory cells of the NAND string may not be sufficiently erased until application of N+1 or more erase voltage pulses.

FIG. 16 illustrates an additional capacitive coupling effect between the floating gates of individual memory cells of the NAND string by arrows 536. For example, the coupling between neighboring floating gates on WL0 and WL1 may be on the order of 2-5%, but may be smaller or larger depending on the dimension and shape of the memory cells. As a result, a voltage present on the floating gate of memory cell 516 will influence the voltage of the floating gate of memory cell 514 and vice versa. A similar coupling will be present between the floating gates of memory cells 514 and 512, connected to WL2, and so on. This coupling exists in both directions, as indicated by the double head on arrows 536. These coupling effects will be seen among all memory cells of the NAND string at various levels but the impact of the coupling will be less than that on the end memory cells as the bias voltages on the neighboring control gates and floating gates are different from the bias condition on the select gates. During the presence of the erase voltage pulse, the voltage of each floating gate is significantly less than the voltage present at the select gates. Thus, the amount of voltage induced in each floating gate due to coupling between the floating gates of individual memory cells will be less than the voltage that is induced in the floating gates of the end memory cells due to coupling to the adjacent select gates. Nevertheless, each memory cell of the NAND string can be expected to have a slightly differing net charge present at its floating gate and a correspondingly different erase behavior due to such coupling.

Figure 18A:
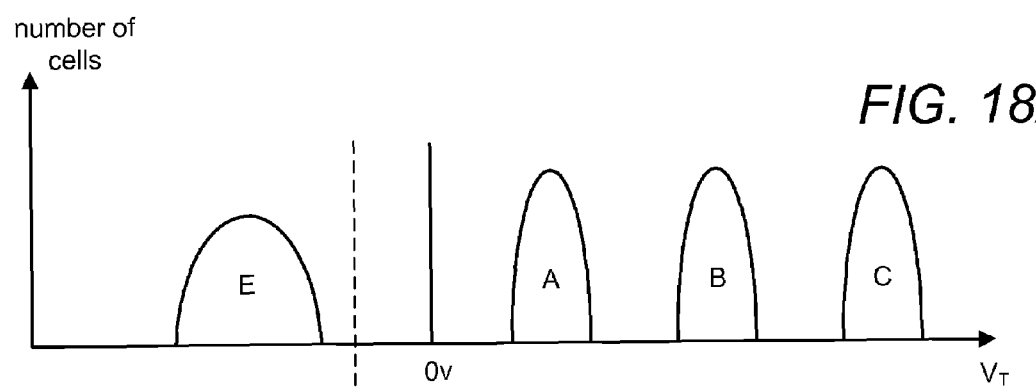
FIGS. 18A and 18B depict exemplary individual threshold voltage distributions for the end and interior memory cells of a NAND string after completing an erase operation.
Figure 18B:
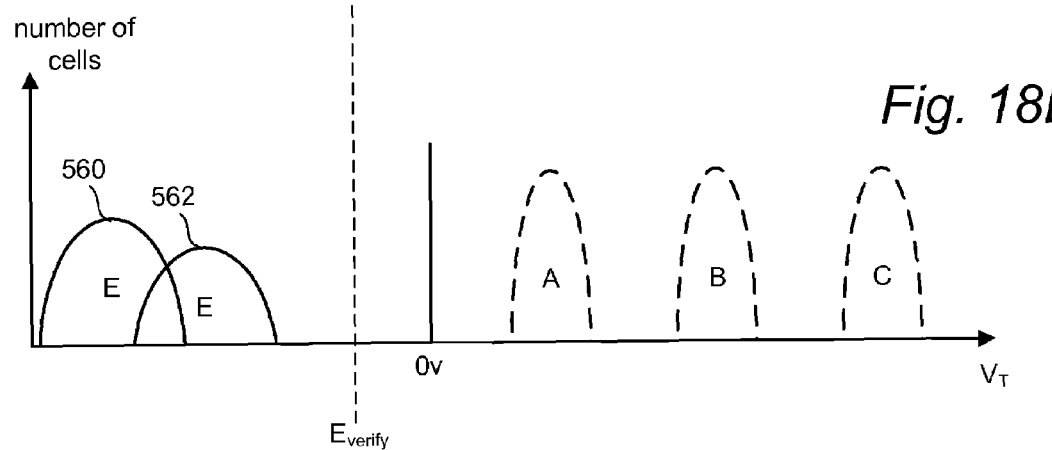

FIG. 18A shows the erased (E) and programmed (A,B,C) threshold voltage $V_T$ distributions of a four state or four level memory device after data has been written into the memory array. FIG. 18B depicts the same four state memory device after an erase operation has been completed. The threshold voltage distributions for the memory cells of the interior word lines and end word lines are depicted separately. Distribution 560 shows the threshold voltage distribution for the interior word lines, which are erased more deeply than the end word lines, depicted by distribution 562. In some NAND memory device implementations, the interior memory cells will be about 0.5-1V deeper erased than the end memory cells because of capacitive charge coupling from the select gates. The memory cells of both the interior and end word lines are in general erased deeper than required. To guarantee that all or most memory cells can be erased with one erase voltage pulse after a number of write/erase cycles, the selected size of the first erase voltage pulse is generally larger than required to erase all the cells of the fresh device (not having undergone many write/erase cycles) in one pulse. Thus, a fresh memory device may have threshold voltage distributions as shown in FIG. 18B after undergoing an erase operation.

When erase verification of a number of memory cells is performed at a NAND string level or higher (e.g., on a block or other unit of strings), disparate erase times or behavior amongst memory cells can lead to over stressing and over erasing certain memory cells. For example, the interior memory cells of a NAND string may be over erased while attempting to sufficiently erase the end memory cells of the string. As previously described, the interior memory cells will erase faster than the end memory cells. If verification is performed at a NAND string level, the NAND string will continue to receive an erase voltage pulse at the p-well until each memory cell of the string is erased. Therefore, even though the interior memory cells may sufficiently erase after a lower number of erase voltage pulses than the end memory cells, the interior memory cells will receive additional erase voltage pulses until each memory cell of the string is verified as erased.

A greater stress is placed on the interior memory cells than is necessary because of over erasure. Over erasing the interior memory cells because of the slower erase times of the end memory cells can decrease the life span of the interior memory cells and an overall non-volatile memory system. As understood in the art, application of a large potential across the tunnel oxide layer of a transistor stresses the oxide material. Application of a high enough potential across the tunnel oxide layer or application of a lower potential a number of times can eventually lead to a breakdown of the oxide layer.

Disparate erase behavior between memory cells can also lead to increased erase operation times because of additional operations that may be performed to change the threshold voltage of a memory cell after being erased. When flash memory cells are erased, the goal is that all erased cells have a negative threshold voltage within a predefined range of negative threshold voltages. As illustrated, however, the erase process may result in some cells having negative threshold voltages below the predefined range. Memory cells having a threshold voltage that is too low may not subsequently program properly or may cause other cells to not program properly (e.g., by increasing the probability that program disturb occurs). Thus, over-erased devices will often undergo soft programming. Memory cells with threshold voltages of significantly lower values within the predefined range will receive a small amount of programming so that the threshold voltage is raised to be within the predefined range. The soft program process requires an additional operation to be performed and decreases memory performance due to increased erase times as soft programming is usually considered part of the erase operation.

In accordance with one embodiment, the word lines of a set of memory cells being erased are divided into subsets which are independently verified such that additional erase pulses can be provided to select word lines having slower erasing memory cells. In this manner, faster erasing word lines are not over-erased and the memory cells of all the word lines in the set will have the same (or substantially the same) threshold voltage distributions after an erase operation.

Figure 19:
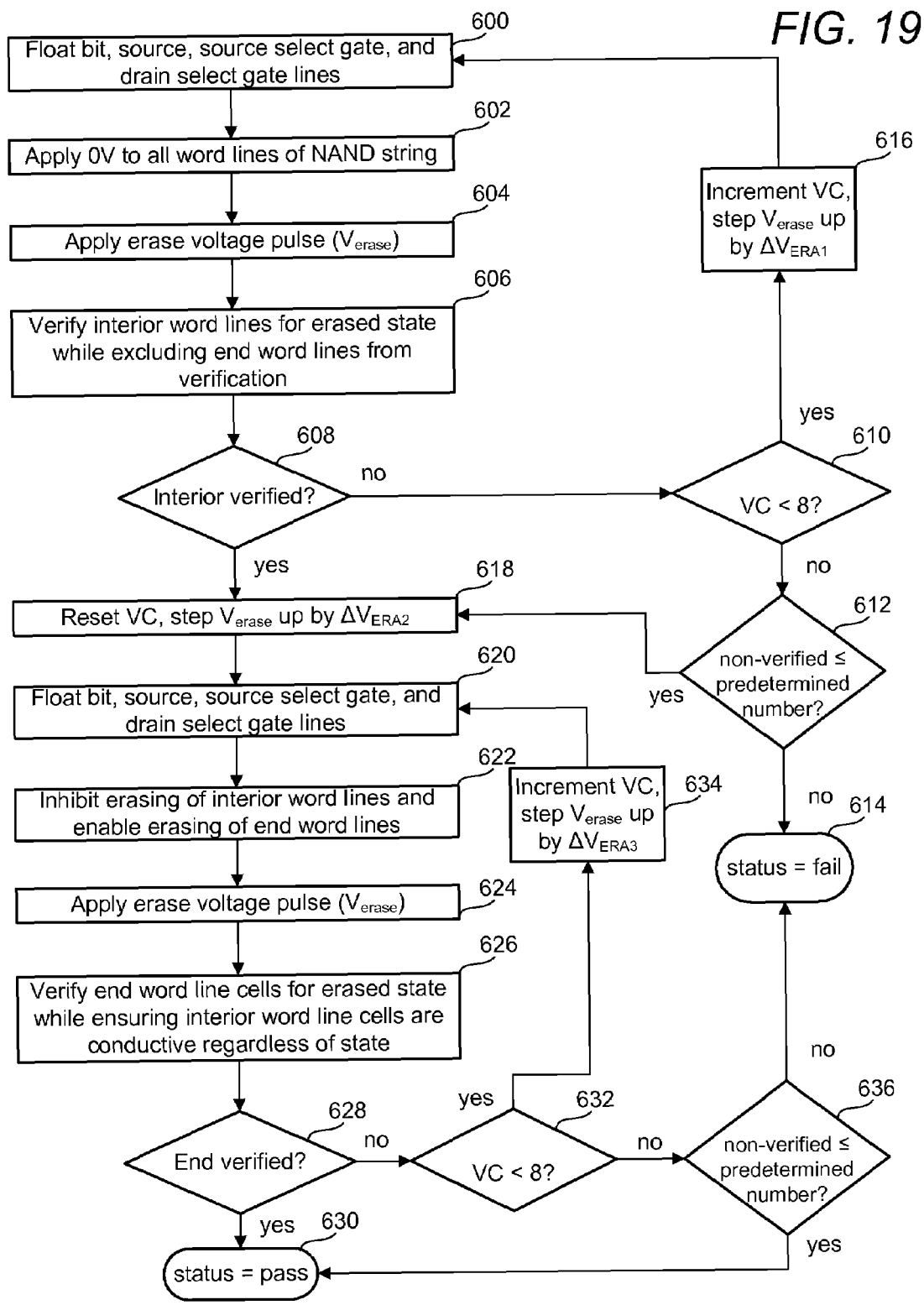
FIG. 19 is a flowchart for erasing a set of non-volatile storage elements in accordance with one embodiment of the present disclosure.

FIG. 19 is a flow chart depicting a method for erasing a set of memory cells in accordance with one embodiment. It will be appreciated by those of ordinary skill in the art that multiple NAND strings can be operated upon in parallel such as to erase a block of memory cells according to the method of FIG. 19. Additionally, other units of cells can also be operated upon in accordance with the described embodiments. In one embodiment, erasing according to the flowchart of FIG. 19 can be performed for erase step 340 of FIG. 7. In one embodiment, erasing according to FIG. 19 is performed after controller 318 receives a request from the host to erase or program a set of memory cells.

The bit, source, source select gate, and drain select gate lines for the NAND string are floated at step 600. At step 602, zero volts (or ground) is applied to each word line of the NAND string. Steps 600 and 602 enable erasing of the entire set of memory cells, which can include the NAND string or multiple NAND strings in parallel. At step 604, the erase voltage pulse $V_{erase}$ is applied to the p-well region of the NAND string or strings. At step 606, the memory cells connected to the interior word lines are verified for an erased state. The memory cells connected to the end word lines are excluded from verification so that only the interior memory cells are verified. The end word lines can be excluded from verification by applying a voltage to them that is sufficient to turn on a memory cell, whether or not it is erased. This voltage can be larger than the erase verify voltage $E_{verify}$ applied to the interior word lines. Numerous voltage levels can be used at step 606. For example, a voltage large enough to turn on a memory cell programmed to the highest state could be used, although a voltage only slightly larger than the erase verify voltage will be sufficient in most embodiments. The important factor is that the memory cells connected to the end word lines be conductive while verifying the interior word lines.

At step 608, it is determined whether each NAND string was successfully verified at step 606 as having its interior memory cells erased. In one embodiment, step 608 and the interior memory cell erase are deemed successful only if every NAND string is successfully verified as having its interior memory cells erased. In another embodiment, step 608 and the interior memory cell erase are deemed successful if only a predetermined number of NAND strings are successfully verified as having their interior memory cells erased. By determining that the interior memory cell erase is successful based on a predetermined number of NAND strings rather than every NAND string, the verification process can stop before the maximum erase loop number is reached (step 450), This can avoid over-erasing NAND strings due to one or a small number of difficult to erase or defective NAND strings.

If all or the predetermined number of NAND strings are not successfully verified at step 608, the method branches to step 610 where a verify counter VC is checked against an erase limit value. The verify counter is used to limit the number of iterations of the erase cycle. One example of an erase limit is 8, however, other values can be used. If the verify counter is less than the erase limit value, then VC is incremented by 1 and the value of the erase voltage pulse $V_{erase}$ is stepped up by a first step size or increment value $\Delta V_{ERA1}$. In one embodiment, $\Delta V_{ERA1}$ is about 0.5V to 1V.

The first erase voltage pulse applied at step 604 is chosen in one embodiment to have an amplitude such that, both before and after write erase cycling, the cells connected to the interior word lines are just erased, without being over-erased, after application of the first pulse. In this manner, the interior memory cells can be erased in one pulse such that for the majority of the time, the interior word lines will be verified after just one iteration of steps 600 through 606. Accordingly, $\Delta V_{ERA1}$ can be a relatively small value in order to just erase the interior memory cells in those instances where a further iteration is needed (e.g., after many write erase cycles). More details regarding the various step sizes that can be used in accordance with embodiments will be discussed with FIGS. 22A and 22B.

If the verify counter is not less than 8, then the method proceeds to step 6152 where the number of non-verified NAND strings is compared with a pre-determined number. If the number that is non-verified is less than or equal to the pre-determined number, then the method proceeds to step 616. If the number of non-verified strings is not less than the pre-determined number, then a status of fail is reported for the operation at step 614. Step 612 is optional. For example, in embodiments where step 608 is deemed successful based on less than all of the NAND strings, step 608 may be omitted.

After the yes branches of steps 608 or 612, the memory cells of the interior word lines have been verified as erased. Additionally, all of the memory cells connected to all the word lines of the set being erased have had their floating gate charges increased (charge increased as electrons removed) as a result of steps 600 through 606. However, the end memory cells have not yet been verified as in an erased state. As previously described, these end memory cells erase slower than the interior memory cells. Thus, having confirmed that the faster memory cells are now erased, attention can be directed to the end memory cells to provide additional erasing therefore. In this manner, the interior and end memory cells of a set of memory cells will be erased to about the same level after completion of the erase operation.

At step 618, the verify counter VC is reset to zero. Additionally, the erase voltage $V_{erase}$ is stepped up by a second increment size of $\Delta V_{ERA2}$. $\Delta V_{ERA2}$ can be larger than $\Delta V_{ERA1}$. In one embodiment, $\Delta V_{ERA2}$ can be about 1V to 2V. $\Delta V_{ERA2}$ is preferably chosen such that after application of a single erase voltage pulse at the increased level, the end memory cells will be erased both before and after write/erase cycling. At step 620, the bit, source, source select gate, and drain select gate lines are again floated. At step 622, the interior word lines are inhibited from further erasing and the end word lines are enabled for further erasing. The interior memory cells can be inhibited from erasing during subsequent erase voltage pulses by floating the interior word lines. The end memory cells can be enabled for erasing by applying 0V to the end word lines. After setting up this condition, the first erase voltage pulse at the increased level is applied to the set of memory cells at step 624. At step 626, the end word lines are verified for an erased state while excluding the interior word lines from verification. Again, as in step 606, this can be accomplished by applying the erase verify voltage to the end word lines, while applying a voltage sufficient to turn on the memory cells of the interior word lines, regardless of their state, to the interior word lines. This voltage applied to the interior word lines will be larger than the erase verify voltage applied to the end word lines. It should be noted, however, that in some embodiments the entire NAND string can be verified at step 626 for an erased state. The interior memory cells have already been verified as erased and thus, they should be conductive under application of the erase verify voltage. Therefore, each memory cell of the string can be verified at step 626 in this alternative embodiment. However, it may be preferred to apply a larger voltage to the interior memory cells in order that verification can just be performed on the end word lines which have not yet been verified.

At step 628, it is determined whether each NAND string was successfully verified as having its end memory cells erased. Like step 608, a successful determination at step 628 can be made when all or only a predetermined number of NAND strings are successfully verified. If all or a predetermined number of NAND strings are successfully verified, a status of pass is reported at step 630. If all or the predetermined number are not successfully verified, the verify counter is checked against the erase limit value at step 632. If the verify counter is less than the limit, the method proceeds to step 634, where the verify counter is incremented by one and the erase voltage $V_{erase}$ is stepped up by a third increment step size of $\Delta V_{ERA3}$.

In one embodiment, $\Delta V_{ERA3}$ is the same value as $\Delta V_{ERA1}$. In other embodiments, $\Delta V_{ERA3}$ is larger than $\Delta V_{ERA1}$ since the end memory cells are slower to erase and may benefit from a larger increment value to speed up their erase. The result of step 618 and 634 is that the erase voltage pulse is increased by a large amount after verifying the interior word lines for a first application of the erase voltage to the end memory cells. It is then increased by a smaller amount thereafter at step 634 if multiple iterations are required in order to fully erase the end memory cells. Again, more details and alternatives for the increment values will be discussed hereinafter. If the verify counter is not less than 8, then the number of non-verified NAND strings is compared with a predetermined number at step 636. Like step 612, step 636 is optional. If the number of non-verified strings is less than the predetermined number, then a status of pass is reported at step 630. If however, the number of non-verified NAND strings is greater than the predetermined number, then a status of fail is reported at step 614.

FIG. 20 is a table showing the bias conditions for the various sub operations performed as part of the erase operation of FIG. 19. Column 660 sets forth the bias conditions for erasing the memory cells of all the word lines of the set of word lines being erased. Column 650 corresponds to steps 600 through 604 of FIG. 19. In these steps all the memory cells of each word line have the charge at their floating gate increased by transferring electrons therefrom. The bit and source lines are floating as well as the source and drain select gate lines. Each word line is supplied with 0V in order to enable erasing thereof. The p-well receives the erase voltage and electrons are transferred from the floating gates of each memory cell of the set by virtue of the potential created by applying 0V to the word lines and $V_{erase}$ to the p-well.

Column 662 sets forth the bias conditions for verifying just the interior word lines for an erased state. Column 662 corresponds to step 606 of FIG. 19. The bit line is floating while the source line is at $V_{DD}$. The drain select gate and source select gate lines are supplied with a positive voltage $V_{SG}$ sufficient to turn on both select gates. $V_{SG}$ is typically larger than $V_{DD}$. For example, $V_{SG}$ can be about 4-4.5V in one embodiment. The interior word lines are provided with the erase verify voltage (e.g., 0V) for the operation. Word line $WL_0$ and word line $WL_n$ are provided with a voltage $V_{use1}$. $V_{use1}$ can be a range of voltages as previously described, but is typically chosen so as to ensure conduction of the memory cells connected at word lines $WL_0$ and $WL_n$. For example, $V_{use1}$ could be a larger voltage than any of the potential voltages of a programmed memory cell. However, it is sufficient in most instances to use a value only slightly larger than the erase verify voltage since even the end memory cells are erased to some extent after application of the first erase voltage pulse. By using $V_{use1}$ as the voltage applied to word line $WL_0$ and word line $WL_n$, the end memory cells are excluded from the interior word line verification operation at step 606. To verify whether the interior memory cells are erased, the bias conditions of column 662 are applied to a NAND string and the bit line voltage is sensed. If the interior memory cells are erased sufficiently deep, they will be in the on state and provide a conduction path from the source line to the bit line. A current will be induced through the NAND string and the bit line voltage will increase. After a predetermined amount of time the bit line voltage is sensed or checked by a sense amplifier. If the bit line voltage has reached a predetermined level, the interior memory cells are verified as erased. If the interior memory cells are not erased sufficiently deep, they will not be in the on state and therefore, will not conduct any current or will conduct too little current. As a result, the bit line voltage will not increase up to the predetermined level. When the bit line voltage is sensed after the predetermined amount of time, it will not have reached the predetermined level and the interior memory cells will not be verified as erased.

Column 664 sets forth the bias conditions for erasing only the memory cells connected to the end word lines of the set being erased. Column 664 corresponds to steps 620 through 624 of FIG. 19. As with erasing all the word lines, the bit line, source line, source select gate line, and drain select gate line are all floating. Additionally, the p-well will be supplied with the erase voltage $V_{erase}$. To inhibit further erasing of the memory cells of the interior word lines (which have already been verified as erased), the interior word lines are floated while the end word lines are provided with 0V. In this manner, the interior word lines will couple to the p-well and create no erase potential across the tunnel dielectric region of the memory cells connected thereto. However, by supplying 0V to the end word lines, those memory cells will be enabled for erasing. Thus, just the memory cells of the end word lines are erased when the erase voltage pulse is applied to the p-well.

Column 666 sets forth the bias conditions for verifying the erased state of just the end word lines. Column 666 corresponds to step 626 of FIG. 19. As with the interior word line verification operation of column 652, the bit line is floating while the source line is at $V_{DD}$. The p-well is grounded and the drain select gate and source select gate are turned on by voltage $V_{SG}$. In order to verify the end word lines while excluding the interior word lines from verification, the erase verify voltage $E_{verify}$ (e.g., 0V) is applied to word lines $WL_0$ and $WL_n$, while $V_{use1}$ is provided to the interior word lines. $V_{use1}$ will ensure conduction of the memory cells of the interior word lines such that the erased state of just the end word lines can be tested. If the end memory cells are sufficiently erased, they will turn on under application of the $E_{verify}$ voltage. The bit line voltage will increase up to or beyond a predetermined level which indicates the end memory cells are erased. If the end memory cells are not sufficiently erased, they will remain off or at least not sufficiently turned on under application of the $E_{verify}$ voltage. The bit line voltage will not increase up to the predetermined level which indicates that the end memory cells are not yet erased. As previously discussed, the entire NAND string can be optionally verified since the interior memory cells have previously been verified at step 606. Thus, the erase verify voltage could be applied to the interior word lines for the end word line verification since they should conduct under the erase verify voltage. However, it may be beneficial to supply $V_{use1}$ to ensure conduction in order to only test for an erased state of the end memory cells.

Figure 21A:
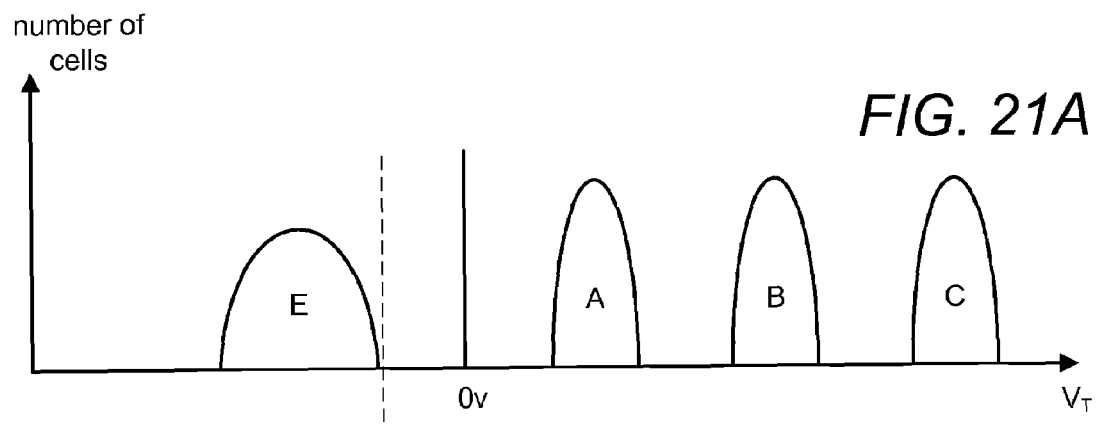
FIGS. 21A-21C depict the threshold voltage distributions of the end memory cells and interior memory cells of a NAND string at various points during an erase operation according to one embodiment of the present disclosure.
Figure 21B:
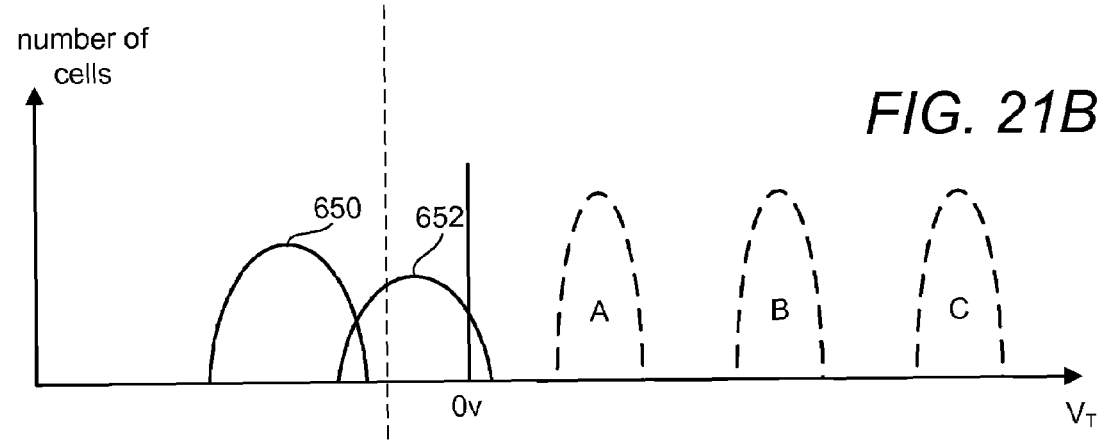
Figure 21C:
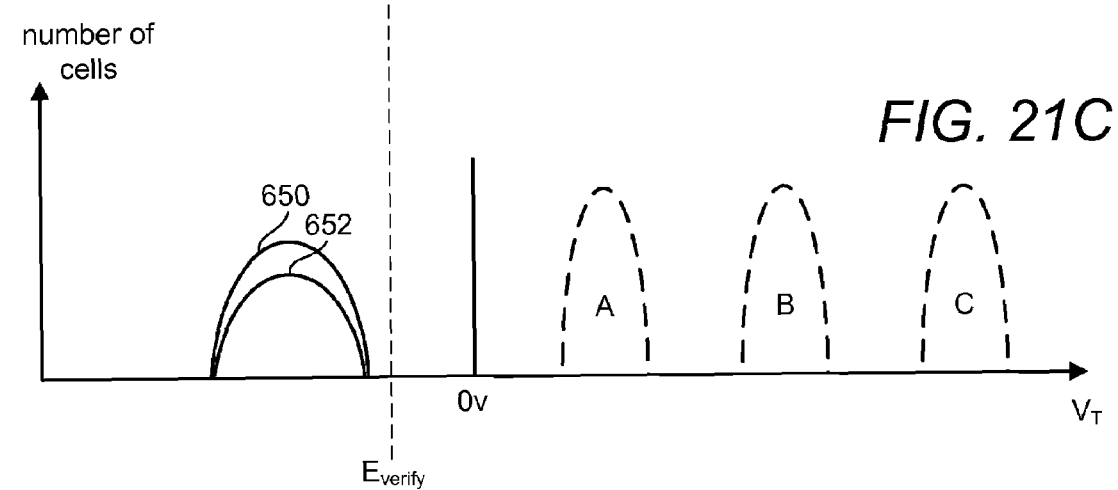

FIG. 21A-21C depict the improved erase threshold voltage distributions of a set of memory cells erased according to embodiments. FIG. 21A shows the erased and programmed threshold voltage distributions for a four level NAND memory device after data has been written into the memory array. FIG. 21B shows the erased threshold voltage distributions for the memory cells of the device after completion of application of a single erase voltage pulse. For example, FIG. 21B can correspond to the time at which step 604 of FIG. 19 has been completed according to the bias conditions of FIG. 20, column 660. Typically, and as shown in FIG. 21B, after application of the first erase voltage pulse only the memory cells of the interior word lines (shown in distribution 670) will be sufficiently erased. The memory cells of the end word lines (shown in distribution 672) have had negative charge removed from their floating gates, but not enough such that they are in the actual erased state. This is due to the disparate erase behavior of the differing word lines because of coupling between the select gates and the floating gates of the end word lines. FIG. 21C shows the erased threshold distributions for the subsets of memory cells after additional erase pulses have been applied only to the end word lines of the set being erased. For example, FIG. 21C can correspond to the time after completion of step 624 in FIG. 19. This could be after one additional erase pulse has been applied to the end word lines, or after multiple erase pulses have been applied through multiple iterations of steps 620-634. As a result of using the method depicted in FIGS. 19 and 20, the interior word lines and the end word lines have the memory cells connected thereto erased to a similar threshold voltage. Thus, over-erasure of the interior middle word lines due to the slower erasing end word lines has been prevented. By dividing up the verification of the different subsets of memory cells, the disparate erase behavior has been compensated for such that all the memory cells end up in about the same threshold voltage distribution.

Division of word lines within a NAND string can be made in different ways in other embodiments. For example, the two most end word lines of a NAND string (e.g., WL0, WL1, WL$_{n-1}$, and WL$_n$) can be grouped together as the end word lines and the remaining word lines (WL2-WL$_{n-2}$) grouped together as the interior word lines. In such an embodiment, step 606 of FIG. 19 will include verifying word lines WL2-WL$_{n-2}$ and steps 622 and 626 will be performed to further erase and verify word lines WL0, WL1, WL$_{n-1}$, and WL$_n$. In yet another embodiment, six or more word lines could be grouped together as the end word lines. Other groupings can also be implemented.

Figure 22A:
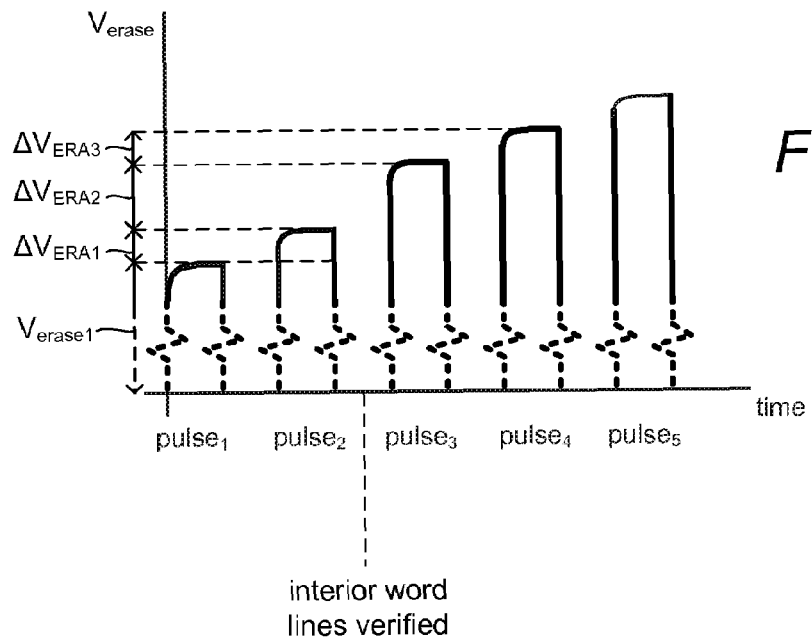
FIGS. 22A-22B are graphs depicting erase voltage signals in accordance with one embodiment of the present disclosure.
Figure 22B:
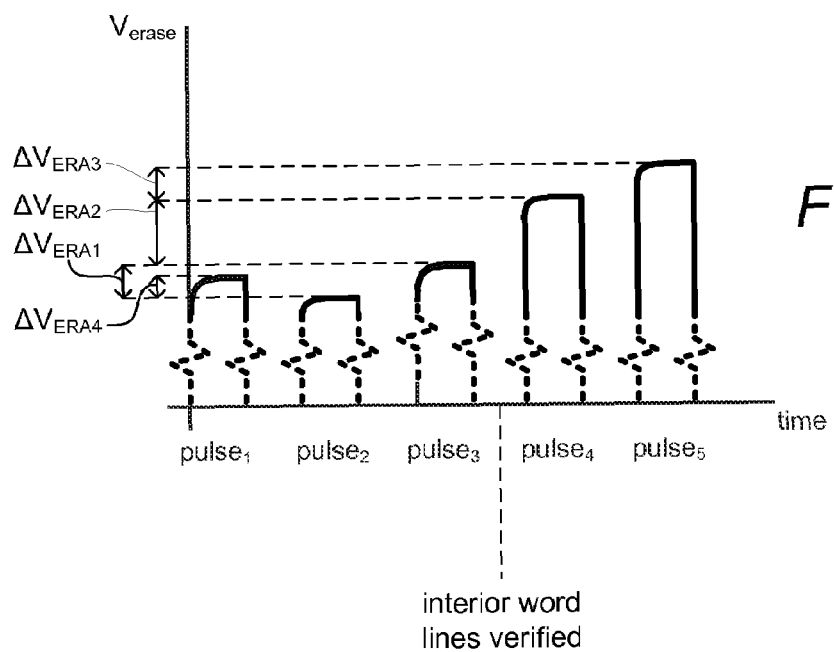

FIGS. 22A and 22B depict erase voltage signals that can be used in accordance with various embodiments that verify the interior word lines separately as shown in FIGS. 19-20. FIG. 22A shows a first erase voltage pulse, pulse$_1$, having a magnitude of V$_{erase1}$. The first pulse can be the first pulse applied to the set of memory cells being erased at step 604 of FIG. 19. This pulse is used to erase all memory cells of the set. In some embodiments, the first value of the erase pulse can be about 15V to 20V. In one embodiment, it is preferred that the magnitude of the first erase pulse be chosen in such a way that both before and after write/erase cycling, the cells on the interior word lines will be just erased (and without being over-erased) after application of the single erase voltage pulse. However, after write/erase cycling, or due to the disparate parameters of individually constructed memory devices, all interior memory cells may not be erased after the first pulse. In other embodiments, the first erase voltage pulse may be chosen such that only before write/erase cycling or only during a limited number of write/erase cycles, the interior memory cells will be erased after application of the first pulse. After extended write/erase cycling, more pulses may be needed. This technique can reduce the over erase at the beginning of write/erase cycling at the expense of more erase voltage pulses after extended write/erase cycling.

As shown in FIG. 22A, a second pulse, pulse$_2$, is applied before the interior word lines are successfully verified as erased. The erase voltage signal is increased by a step size of $\Delta V_{ERA1}$ from pulse$_1$ to pulse$_2$. The increase by $\Delta V_{ERA1}$ corresponds to step 616 of FIG. 19. $\Delta V_{ERA1}$ can be about 0.5V to 1V in one embodiment. After application of the second erase voltage pulse all of the interior word lines are successfully verified. This can correspond to step 608 of FIG. 19. After all the interior word lines are verified, erasing only continues for the end memory cells. These memory cells erase slower, thus the erase voltage signal is increased by a second larger increment step size of $\Delta V_{ERA2}$ for application of the third erase voltage pulse, pulse$_3$. This can correspond to step 618 of FIG. 19. It is preferred in one embodiment that $\Delta V_{ERA2}$ be chosen such that after application of the first erase voltage pulse (e.g., pulse$_3$) to just the end memory cells, all of the end memory cells will be erased, both before and after write erase cycling. In one embodiment, $\Delta V_{ERA2}$ is about 2 volts. Application of pulse$_3$ corresponds to step 624 of FIG. 19. The pulses are increased by a third step size $\Delta V_{ERA3}$ thereafter. This corresponds to step 634 of FIG. 19. $\Delta V_{ERA3}$ can be equal to $\Delta V_{ERA1}$ in one embodiment, or can be larger or smaller in other embodiments.

FIG. 22B depicts an alternate embodiment of the erase voltage signal that can be used when performing the method of FIG. 19. FIG. 22B uses a lower second erase voltage pulse as with the embodiment of FIG. 13A. In this embodiment, the first erase voltage pulse is chosen to be larger than the second pulse. The first erase voltage pulse, pulse$_1$, is chosen to induce a large voltage shift (for example, about 6V). This erase voltage pulse is still ideally chosen such that the interior memory cells will be erased after application of the single pulse, both before and after a certain number of write/erase cycles. However, it recognizes that it may take more than one pulse to erase all the interior memory cells in some instances. In other embodiments, the first erase voltage pulse may be chosen such that only before write/erase cycling or only during a limited number of write/erase cycles, the interior memory cells will be erased after application of the first erase voltage pulse. After extended write/erase cycling, more pulses may be needed. In the embodiment of FIG. 22B, a second and third pulse are both needed before all the interior memory cells are verified as erased. A second erase voltage pulse, pulse$_2$, is smaller by a step size of $\Delta V_{ERA4}$ than pulse$_1$. The decrementation of the erase voltage signal also corresponds to step 616 of FIG. 19. However, rather than incrementing the erase voltage pulse, it is decreased in size by $\Delta V_{ERA4}$. This ensures that the interior memory cells are not over-erased after application of the second erase voltage pulse. The second pulse is made smaller to induce a smaller shift in the threshold voltage of the memory cells. If a third erase voltage pulse is needed, such as shown by pulse$_3$, it can then be increased by a step size of $\Delta V_{ERA1}$ to ensure that electrons continue to be transferred from the floating gates of those memory cells.

After application of the third erase voltage pulse, the interior memory cells are verified as erased. The remainder of FIG. 22B is the same as in FIG. 22A. The first erase voltage pulse, pulse$_4$, that is applied to just the end memory cells, is increased from the previous erase voltage pulse size by a magnitude of $\Delta V_{ERA2}$. This corresponds to step 618 of FIG. 19. In the embodiment of FIG. 22B, an additional erase voltage pulse is needed to erase the end memory cells. Thus the fifth erase voltage pulse, pulse$_5$, is increased by a value of $\Delta V_{ERA3}$ over the fourth erase voltage pulse value. In one embodiment, after applying the first erase voltage pulse, pulse$_1$, the second erase voltage pulse, pulse$_2$, can be the same size of pulse$_1$ rather than decreasing in size. In such an embodiment, any erase voltage pulses thereafter needed to erase the interior memory cells will be increased by a value of $\Delta V_{ERA1}$ as shown.

FIG. 23 is a flow chart depicting a method in accordance with one embodiment for performing step 616 of FIG. 19. In FIG. 23, step 616 is performed as shown by the erase voltage pulse of FIG. 22B. In step 616 of FIG. 19, a determination is first made at step 680 whether the verify counter VC is equal to zero, indicating that only one erase voltage pulse has been applied to the set of memory cells thus far. If the verify counter is equal to zero, indicating that this is the first change to the size of the erase voltage pulse, then the method proceeds to step 682, where the erase voltage pulse size is stepped down by the value $\Delta V_{ERA4}$. This will result in a pulse like pulse$_2$ being applied during the next iteration. If, however, the verify counter is not equal to zero, indicating that this is the second or more change to the erase voltage signal, then the method proceeds to step 684 where the erase voltage signal is stepped up by $\Delta V_{ERA1}$, resulting in a pulse like pulse$_3$ of FIG. 22B. From steps 652 and 654, the method again proceeds to step 600 of FIG. 19.

Capacitive coupling can also lead to disparate behavior amongst memory cells of a NAND string during soft programming operations. A soft programming operation is typically carried out by applying soft programming pulses to all the word lines of a selected block at the same time. Soft programming is performed after erasing a set of memory cells. The soft programming is performed to narrow the width of the erased threshold distribution for the set of memory cells and also to normalize the erased threshold distribution of the individual memory cells within the set. Soft programming pulses are lower in amplitude than regular programming pulses (e.g., as shown in FIG. 6) to avoid that the cells reach a programmed state. What is desired as a result of the soft programming is that the cells have a narrower erase threshold voltage distribution. Consequently, the threshold voltages are not intended to be shifted into a programmed state range.

After application of each soft programming pulse, a verify operation similar to a typical erase verify operation as shown in FIG. 10 is carried out. During the verification for a soft programming operation, conduction through a NAND string is tested with each of the memory cells receiving the erase verify voltage at its gate. Once a certain number of NAND strings in the selected block have reached a non-conducting state during the erase verify operation (indicating that at least one cell of the string has reached the erase verify level), soft programming ends. The result of soft programming is that the distribution of the erased memory cells in the string shifts up closer to the erase verify level. Using soft programming, the erase threshold voltage distribution can be shifted up to a level close to the erase verify level, even if the memory cells were originally over-erased.

Because of capacitive coupling from the select gates to the memory cells of the end word lines of a NAND string, the soft programming behavior of the memory cells of the string are different. Capacitive coupling between the select gates and the end memory cells slows down these cells during the soft programming operation. Thus, it can be expected that the memory cells of the end word lines will be in a deeper erased state than those of the interior word lines after soft programming.

Figure 24:
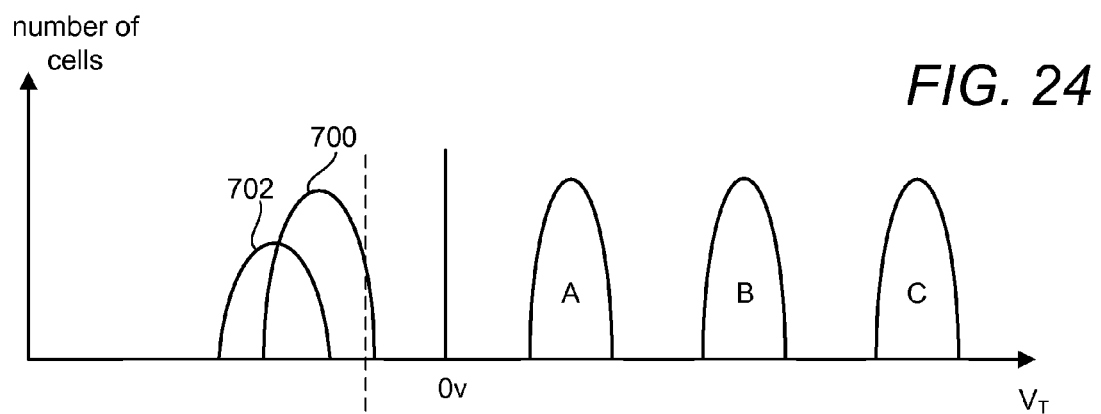
FIG. 24 depicts exemplary threshold voltage distributions of the end memory cells and interior memory cells of a NAND string after soft programming according to the prior art.

FIG. 24 shows the erased threshold voltage distribution for the memory cells of a NAND string after undergoing soft programming. Distribution 700 depicts the erased threshold distribution of the interior word line memory cells after undergoing soft programming. Soft programming has shifted this erased threshold voltage distribution closer to the erase verify level. Since the verification for soft programming verifies a group of cells as successfully soft programmed when a predetermined number of NAND strings are non-conductive under application of the erase verify voltage, a certain number of cells will have their threshold voltage shifted beyond the erase verify level. The actual number having a threshold voltage higher than the erase verify level will depend upon the actual verification scheme employed. For example, if the scheme verified soft programming as complete when a single string becomes non-conductive, only one cell in the group may be higher than the verify level. In other schemes, thousands of cells within the group may have their threshold voltage shifted just beyond the erase verify level. Distribution 702 depicts the threshold voltages of the end memory cells. Because of the slower soft programming time for the end memory cells, their threshold voltages have not been shifted as close to the erase verify level.

In accordance with one embodiment, the word lines of a set of memory cells are again divided into subsets such that soft programming can be carried out in a way adapted to the needs of the individual subsets of word lines. The method is similar to the erase verification method depicted in FIG. 19. All of the word lines of the set that are being soft programmed undergo some initial soft programming. After verifying that the set of memory cells or a subset thereof has been successfully soft programmed, additional soft programming can be performed for just the end word lines in order to move them out of their deeper erased state and closer to the erased verify level.

Figure 25:
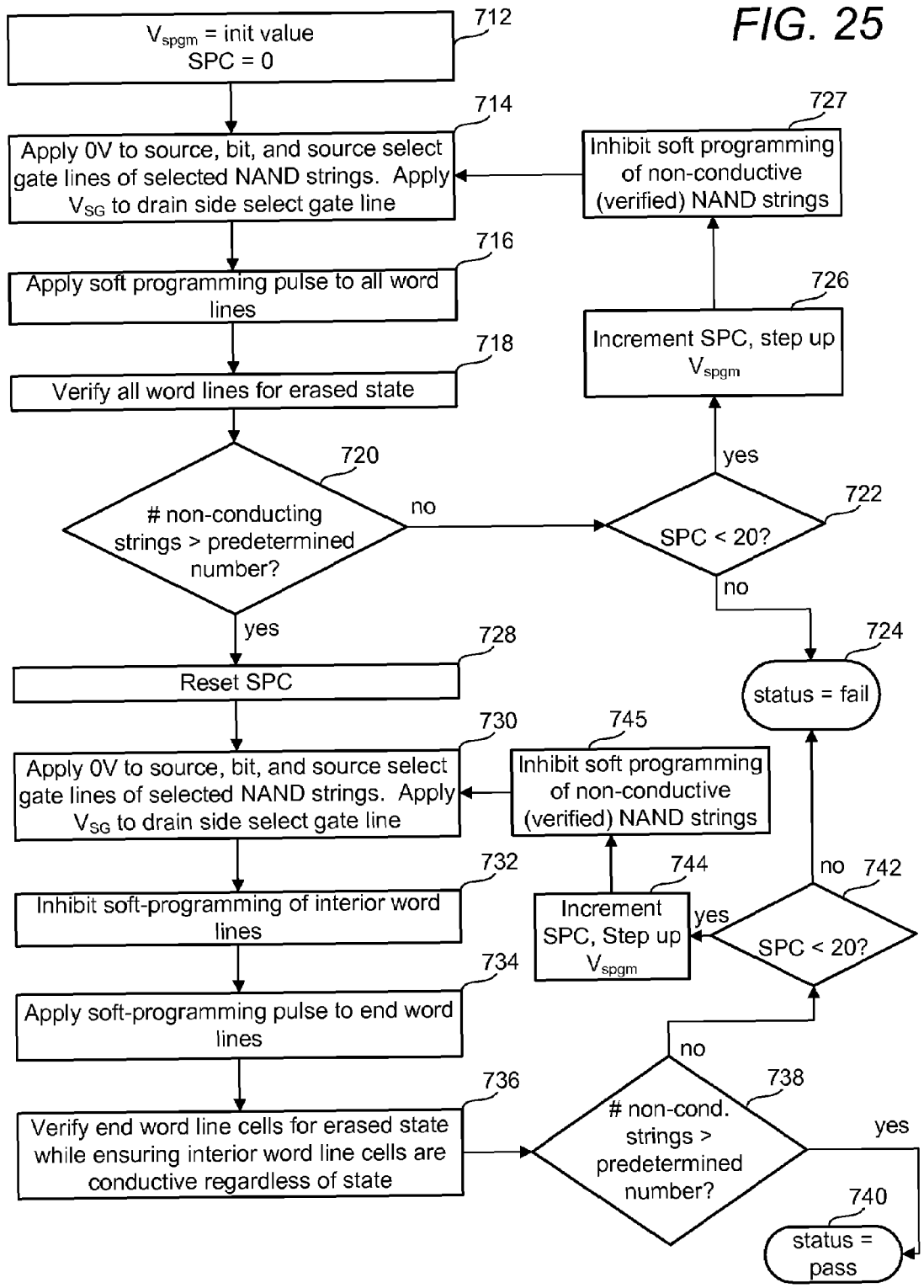
FIG. 25 is a flowchart for soft programming a set of non-volatile storage elements in accordance with one embodiment of the present disclosure.

FIG. 25 depicts a method for soft programming in one embodiment. For example, the method of FIG. 25 could be used to soft-program a plurality of NAND strings of a block of memory cells. In one embodiment, soft programming according to FIG. 25 can be performed for soft programming step 342 of FIG. 7. At step 712, the soft programming voltage signal $V_{SPGM}$ is set to its initial value and the soft programming counter SPC is set to zero. The source, bit, and source select gate lines are grounded at step 714. Additionally, $V_{SG}$ is applied to the drain select gate line. The drain select gate line voltage may be lowered to about 2.5V just before applying the soft programming pulse to allow boosting for soft programming inhibition (step 727) if needed. In other instances it is not. Soft programming inhibition can still occur to a certain extent by the channel which will be biased to $V_{DD}$ (step 727). At step 716, the first soft programming pulse is applied to all the word lines of the set being soft programmed. At step 718, the memory cells of all the word lines are verified for an erased state using the erase verify voltage level. In one embodiment, step 718 can include verifying only the memory cells of the interior word lines while ensuring conduction of the end memory cells. However, the memory cells of the end word lines will conduct in most instances anyway under application of the erase verify voltage as they are slower to soft-program than the memory cells of the interior word lines.

At step 720, the number of non-conducting NAND strings in the block being soft programmed is compared to a predetermined number. If the number of non-conducting strings is not greater than the predetermined number, then the soft programming counter SPC is compared against a predetermined limit value (for example 20) at step 722. If the soft programming counter is not less than 20, then a status of fail is reported at step 724 for the soft programming operation. If the soft programming counter is less than 20, the method proceeds to step 726, where the soft programming counter SPC is incremented by 1 and the soft programming voltage signal is stepped up by a predetermined value. At step 727, the NAND strings that were non-conductive (successfully soft programmed) during the verification at step 718 are inhibited from further soft programming. Soft programming in a particular NAND string can be inhibited by applying a higher voltage such as $V_{DD}$ to the corresponding bit line. By raising the bit line voltage, the channel area of the inhibited NAND string will be boosted to a high voltage during the next soft programming cycle. The voltage difference between the floating gates of the memory cells and channel area of the inhibited NAND string will be too low to cause further soft programming of the cells. The method then proceeds to step 714 to apply an additional soft programming pulse to the set of memory cells.

If the number of non-conducting strings is greater than the predetermined number, indicating that the memory cells have successfully undergone soft programming, the soft programming counter SPC is reset at step 728. In one embodiment, step 728 can further include increasing the soft programming voltage signal. In one embodiment, the increase at step 728 can be the same as in step 726 or another value. In one embodiment for example, the soft programming voltage signal is incremented by a step size of $\Delta V_{spgm1}$ at step 726. At step 728, it can be incremented by a step size of $\Delta V_{spgm2}$, which could be larger than $\Delta V_{spgm1}$. A soft programming voltage signal similar to the erase voltage signal of FIG. 22A can be used in one embodiment.

At step 730, the source, bit, and source select gate lines are grounded and $V_{SG}$ is applied to the drain side select gate line. At step 732, soft programming of the interior word lines is inhibited. Soft programming of the interior word lines can be inhibited by applying a small positive voltage on the order of about 0V to 3V to the interior word lines. In one embodiment, the voltage applied to the interior word lines is larger and on the order of about 5V to 10V. For example, the voltage can be a pass voltage ($V_{pass}$) as typically applied to boost the voltage of a string's channel region to inhibit programming or soft programming. For NAND strings that are to be inhibited from further soft programming (already verified as soft programmed) in further iterations of steps 728-744, the higher voltage will be sufficient to ensure that the channel area of the inhibited NAND strings is sufficiently boosted to avoid further soft programming. At step 734, the soft programming pulse is applied to just the end word lines of the set being erased in order to further soft program the end memory cells. At step 736, the end memory cell word lines are verified for an erased state, while ensuring that the interior word lines are conductive regardless of their state (excluding the interior word lines from verification). The erase verify voltage level can be applied to the end word lines while a voltage of $V_{use1}$ (sufficient to ensure conduction of the interior word lines) is applied to the interior word lines. In this manner, verification is only performed for the end word lines, while excluding the interior word lines from verification.

At step 738, the number of non-conducting strings determined in step 736 is compared against a predetermined number. If the number of non-conducting strings is greater than the predetermined number, indicating that the cells of the end word lines have now shifted up close to the erase verify level, the method proceeds to step 740, where a status of pass is reported. If the number of non-conducting strings is not greater than the predetermined number, then the soft programming counter is compared against a predetermined limit value. If the soft programming counter is greater than the predetermined limit value, a status of fail is reported at step 724 for the operation. If, however, the soft programming counter is less than the predetermined limit value, the soft programming counter is incremented by 1 and the soft programming voltage signal is stepped up at step 744. At step 745, the NAND strings that were non-conductive (successfully soft programmed) during the verification at step 736 are inhibited from further soft programming. The method then proceeds to step 730 for further soft programming of the end memory cells.

In one embodiment, step 744 increments the soft programming voltage signal by the same size as step 726, while in other embodiments, other values are used. For example, if a soft programming voltage signal similar to the erase voltage signal of FIG. 22B is used, step 744 can include increasing by a size $\Delta V_{spgm3}$ (similar to $\Delta_{VERA\ 3}$), step 728 can include increasing by a size $\Delta V_{spgm2}$ (similar to $\Delta_{VERA\ 2}$), and step 726 can include increasing by a size $\Delta V_{spgm1}$ (similar to $\Delta_{VERA\ 1}$). In such an embodiment, step 726 could further include decreasing by a size $\Delta V_{spgm4}$ (similar to $\Delta V_{ERA4}$) during a first iteration and the increasing by a size $\Delta V_{spgm1}$ for subsequent iterations.

Division of word lines within a NAND string for soft programming can be made in different way in different embodiments. For example, the two most end word lines of a NAND string (e.g., WL0, WL1, $WL_{n-1}$, and $WL_n$) can be grouped together as the end word lines and the remaining word lines ($WL2$-$WL_{n-2}$) grouped together as the interior word lines. In such an embodiment, step 732 of FIG. 24 will include inhibiting word lines WL2-WLn-2 and steps 734 and 736 will be performed to further soft program and verify word lines WL0, WL1, $WL_{n-1}$, and $WL_n$. In yet another embodiment, six or more word lines could be grouped together as the end word lines. Other groupings can also be implemented.

FIG. 26 sets forth the bias conditions for the various operations of the flow chart depicted in FIG. 25O. Column 750 sets forth the bias conditions of the soft programming operation for all the memory cells of the set being erased. Column 750 corresponds to steps 714 through 716 of FIG. 25. The bit line, source line, and p-well are at 0V for soft programming. $V_{DD}$ is shown in parenthesis for the bit line voltage to indicate that $V_{DD}$ is applied to those NAND strings that are to be inhibited from soft programming. The source side select gate line is at 0V, while the drain side select gate line is at $V_{SG}$. The soft programming pulse $V_{spgm}$ is applied to each of the word lines of the set in order to raise the threshold voltage of each memory cell connected thereto.

Column 752 sets forth the bias conditions for verifying soft programming of all the memory cells of the set. Column 752 corresponds to step 718 of FIG. 25. These bias conditions are the same as those for verifying erasure of all memory cells in a set of memory cells. The bit line is floating and the p-well is at 0V, while $V_{DD}$ is provided to the source line. Both select gates are turned on by $V_{SG}$. The erase verify voltage is applied to each word line to determine whether the string is non-conductive and thus has at least one memory cell that has reached the erase verify level.

Column 754 sets forth the bias conditions for soft programming just the end word lines. Column 754 corresponds to steps 730 through 734 of FIG. 25. The drain side select gate is turned on by supplying $V_{SG}$ to the drain side select gate line and the source side select gate is turned off by supplying 0V to the source side select gate line. The interior word lines are provided a low positive voltage of $V_{use1}$ (e.g., 0V to 5V). By supplying a small positive voltage to the interior word lines, the memory cells connected thereto can be inhibited from further programming under application of the soft programming pulses. The end word lines receive the soft programming pulse $V_{SPGM}$ in order to undergo further soft programming. When a NAND string that has been verified as soft programmed is to be inhibited from further soft programming, the value of $V_{use1}$ applied to the interior word lines can be a relatively high voltage (e.g., $V_{pass}$=5V-10V) rather than a small positive voltage. Because $V_{DD}$ is also applied to an inhibited string's bit line, the relatively high voltage will cause the channel area of the inhibited NAND string to be boosted to a high voltage during the next soft programming cycle. This keeps the voltage difference between the floating gates of the memory cells and the channel area of the inhibited NAND string sufficiently low so that further soft programming of the cells does not occur.

Column 756 sets forth the soft programming verify bias conditions for just the end word lines. Column 756 can correspond to step 736 of FIG. 25. The bit line is floating, while the source line is at $V_{DD}$. The p-well is at zero volts. Both of the select gates are turned on by supplying $V_{SG}$ to the drain select gate line and the source select gate line. $V_{use1}$ is applied to the interior word lines. As discussed above, the value of $V_{use1}$ used during soft programming (column 754) may be larger than 0V to 3V in some instances. The value of $V_{use1}$ for verification is on the order of 0V to 3V. It need only be higher than the erase verify voltage to be sure the cells of the interior word lines for which soft programming is already completed are in a conducting state. In this manner, the state of the memory cells on the end word lines can be determined independently and verified. Thus, the value of Vuse1 used during soft programming (e.g., 5V to 10V) may be different than the value used during soft programming verification (e.g., 0V to 3V). The erase verify voltage or 0V is applied to the end word lines. In this manner, the interior word lines are excluded from soft programming verification, while the end word lines undergo verification.

Figure 27:
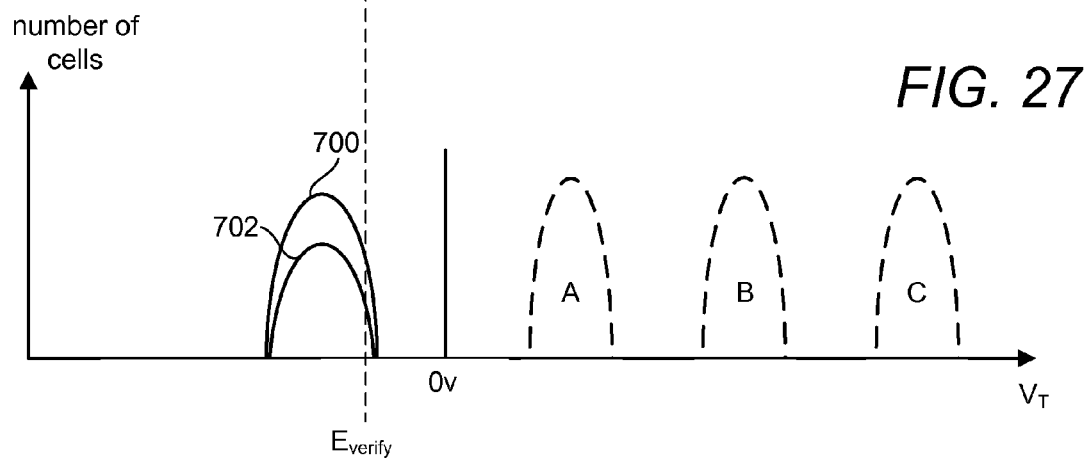
FIG. 27 depicts exemplary threshold voltage distributions of the end memory cells and interior memory cells of a NAND string after soft programming according to one embodiment of the present disclosure.

FIG. 27 depicts the threshold voltage distributions for a set of memory cells after undergoing soft programming according to the embodiment of FIGS. 25 and 26. As shown in FIG. 27, both the erase threshold distributions for the interior and end word lines have been moved up close to the erase verify level. The interior word line threshold voltage distribution 700 is shifted up close to the erase verify level as would occur normally. The end word line distribution 702 has also been moved up close to the erase verify level as a result of the additional soft programming (steps 728-745).

The above examples are provided with respect to NAND type flash memory. However, the principles of the present invention have application to other types of non-volatile memories which utilize a serial structure, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of erasing non-volatile storage, comprising:
applying a first erase voltage pulse to a set of non-volatile storage elements;
applying a second erase voltage pulse to the set of non-volatile storage elements after verifying that one or more non-volatile storage elements of the set are not sufficiently erased subsequent to application of the first erase voltage pulse, the second erase voltage pulse having an equal or lesser magnitude than the first erase voltage pulse; and
applying a third erase voltage pulse to the set of non-volatile storage elements after verifying that one or more non-volatile storage elements of the set are not sufficiently erased subsequent to application of the second erase voltage pulse, the third erase voltage pulse having a greater magnitude than the second erase voltage pulse.

2. The method of claim 1, wherein:
the magnitude of the third erase voltage pulse is greater than the magnitude of the first erase voltage pulse.

3. The method of claim 1, wherein:
the magnitude of the third erase voltage pulse is equal to the magnitude of the first erase voltage pulse.

4. The method of claim 1, wherein:
the magnitude of the third erase voltage pulse is less than the magnitude of the first erase voltage pulse.

5. The method of claim 1, wherein:
the magnitude of the second erase voltage pulse is lower than the magnitude of the first erase voltage pulse by a first amount; and
the magnitude of the third erase voltage pulse is greater than the magnitude of the second erase voltage pulse by a different amount.

6. The method of claim 5, further comprising:
applying a fourth erase voltage pulse to the set of non-volatile storage elements after verifying that one or more non-volatile storage elements of the set are not sufficiently erased subsequent to application of the third erase voltage pulse.

7. The method of claim 1, wherein the set of non-volatile storage elements comprises a block of memory cells organized into a plurality of NAND strings, the method further comprising:
verifying whether the block of memory cells is erased after each erase voltage pulse by verifying whether individual NAND strings are erased;
applying additional erase voltage pulses to the block of memory cells if one or more NAND strings are not verified as erased after applying the third erase voltage pulse, wherein the additional erase voltage pulses are applied until every NAND string of the block is verified as erased.

8. The method of claim 1, wherein the set of non-volatile storage elements comprises a block of memory cells organized into a plurality of NAND strings, the method further comprising:
verifying whether the block of memory cells is erased after each erase voltage pulse by verifying whether individual NAND strings are erased, wherein the block of memory cells is verified as erased when a predetermined number of NAND strings are verified as erased; and
if the predetermined number of NAND strings are not verified as erased after applying the third erase voltage pulse, applying additional erase voltage pulses until the predetermined number of NAND strings are verified as erased.

9. The method of claim 1, further comprising:
applying a pre-program pulse to each non-volatile storage element of the set prior to applying the first erase voltage pulse.

10. The method of claim 1, further comprising:
receiving a request to erase the set of non-volatile storage elements;
performing the steps of applying a first, second, and third erase voltage pulse in response to receiving the request.

11. The method of claim 1, wherein:
the set is a block of flash memory cells.

12. The method of claim 1, wherein:
the set of non-volatile storage elements is coupled to a single set of word lines.

13. The method of claim 12, wherein:
the first erase voltage pulse, the second erase voltage pulse, and the third erase voltage pulse are each applied to a well region for the set of non-volatile storage elements;

the method further comprises grounding each word line of the set while applying the first erase voltage pulse, the second erase voltage pulse, and the third erase voltage pulse.

14. The method of claim 1, wherein the set is a block of non-volatile storage elements coupled to a set of word lines for the block, the method further comprising:
verifying whether each non-volatile storage element of the set is erased after applying the first erase voltage pulse;
verifying whether each non-volatile storage element of the set is erased after applying the second erase voltage pulse; and
verifying whether each non-volatile storage element of the set is erased after applying the third erase voltage pulse.

15. The method of claim 1, further comprising:
verifying whether a first subset of the set of non-volatile storage elements is erased subsequent to applying the second erase voltage pulse and prior to applying the third erase voltage pulse;
if the first subset is verified as erased, inhibiting the first subset from further erasing while enabling a second subset of the set of non-volatile storage elements for further erasing;
wherein if the first subset is verified as erased, applying the third erase voltage pulse is performed while inhibiting the first subset from further erasing and enabling the second subset for further erasing.

16. The method of claim 15, wherein if the first subset is verified as erased prior to applying the third erase voltage pulse:
applying the third erase voltage pulse comprises applying the third erase voltage pulse at a magnitude that is larger than the magnitude of the second erase voltage pulse by a first step size;
the method further comprises:
verifying whether the second subset is erased subsequent to applying the third erase voltage pulse;
if the second subset is not verified as erased subsequent to applying the third erase voltage pulse, applying a fourth erase voltage pulse at a magnitude that is larger than the magnitude of the third erase voltage pulse by a second step size that is smaller than the first step size.

17. The method of claim 15, wherein:
the set of non-volatile storage elements is coupled to a set of word lines;
the first subset of non-volatile storage elements is coupled to a first subset of the set of word lines; and
the second subset of non-volatile storage elements is coupled to a second subset of the set of word lines.

18. A method of erasing non-volatile storage, comprising:
applying an erase voltage to a set of non-volatile storage elements at a first level;
verifying whether the set of non-volatile storage elements is erased after applying the erase voltage;
applying the erase voltage to the set of non-volatile storage elements at a second level that is less than or equal to the first level if the set of non-volatile storage elements is not verified as erased after applying the erase voltage at the first level;
verifying whether the set of non-volatile storage elements is erased after applying the erase voltage at the second level;
applying the erase voltage to the set of non-volatile storage elements at a third level that is greater than the second level if the set of non-volatile storage elements is not verified as erased after applying the erase voltage at the second level.

19. The method of claim 18, wherein:
verifying whether the set of non-volatile storage elements is erased includes determining whether a minimum number of subsets of non-volatile storage elements are erased.

20. The method of claim 19, wherein:
the subsets of non-volatile storage elements are NAND strings, each NAND string including a plurality of non-volatile storage elements and two select gates.

21. The method of claim 18, wherein:
applying the erase voltage at the first level comprises applying a first erase voltage pulse at a first amplitude to a well region for the set of non-volatile storage elements;
applying the erase voltage at the second level comprises applying a second erase voltage pulse at a second amplitude to the well region for the set of non-volatile storage elements;
applying the erase voltage at the third level comprises applying a third erase voltage pulse at a third amplitude to the well region for the set of non-volatile storage elements.

22. A method of erasing non-volatile storage, comprising:
receiving a request to erase a set of non-volatile storage elements having a charge storage region;
applying a series of erase voltage pulses to the set of non-volatile storage elements in order to remove charge from at least a portion of the non-volatile storage elements of the set, the series of erase voltage pulses including a first erase voltage pulse, a second erase voltage pulse applied after the first erase voltage pulse at a smaller or equal amplitude with respect to the first erase voltage pulse, and a third erase voltage pulse applied after the second erase voltage pulse at a larger amplitude with respect to the second erase voltage pulse.

23. The method of claim 22, further comprising:
receiving a request to erase a different set of non-volatile storage elements;
applying a fourth erase voltage pulse to the different set of non-volatile storage elements, the fourth erase voltage pulse having a same amplitude as the first erase voltage pulse;
verifying that the different set is successfully erased after applying the fourth erase voltage pulse; and
providing a status to indicate that the different set is erased in response to verifying that the different set is successfully erased.

24. The method of claim 22, wherein:
the amplitude of the third erase voltage pulse is the same as the amplitude of the first erase voltage pulse.

25. The method of claim 22, wherein:
the set of non-volatile storage elements is a block of NAND flash memory cells in communication with a set of word lines;
applying the series of erase voltage pulses includes applying the first erase voltage pulse, the second erase voltage pulse, and the third erase voltage pulse to a well region for the block of NAND flash memory cells while grounding each word line of the set word lines for the block.

* * * * *